(12) United States Patent
Masuoka et al.

(10) Patent No.: US 8,426,902 B2
(45) Date of Patent: Apr. 23, 2013

(54) SOLID-STATE IMAGING DEVICE

(75) Inventors: Fujio Masuoka, Tokyo (JP); Nozomu Harada, Tokyo (JP)

(73) Assignee: Unisantis Electronics Singapore Pte Ltd., Peninsula Plaza (SG)

( * ) Notice: Subject to any disclaimer, the term of this patent is extended or adjusted under 35 U.S.C. 154(b) by 154 days.

(21) Appl. No.: 13/182,872

(22) Filed: Jul. 14, 2011

(65) Prior Publication Data
US 2012/0025281 A1    Feb. 2, 2012

Related U.S. Application Data

(60) Provisional application No. 61/369,263, filed on Jul. 30, 2010.

(30) Foreign Application Priority Data

Jul. 30, 2010   (JP) .................................. 2010-173003
Dec. 10, 2010   (JP) .................................. 2010-276403

(51) Int. Cl.
    *H01L 31/062*   (2012.01)
    *H01L 31/113*   (2006.01)
(52) U.S. Cl.
    USPC ........................................................ 257/292

(58) Field of Classification Search .................. 257/231, 257/232, 292
    See application file for complete search history.

(56) References Cited

U.S. PATENT DOCUMENTS
7,872,287 B2    1/2011   Masuoka et al.

FOREIGN PATENT DOCUMENTS
WO    WO 2009-034623 A1    3/2009

*Primary Examiner* — William D Coleman
(74) *Attorney, Agent, or Firm* — Brinks Hofer Gilson & Lione

(57) ABSTRACT

A pixel includes at least first to fourth semiconductor tiers. The first semiconductor tier includes a first semiconductor region that is electrically connected to a first external circuit, a second semiconductor region, and a third semiconductor region that is isolated from the first semiconductor region by the second semiconductor region and that is electrically connected to a second external circuit. The second semiconductor tier includes a MOS transistor that has insulating films and gate conductive electrodes that are electrically connected to a third external circuit. The third semiconductor tier includes a photodiode formed of the second and fourth semiconductor regions. A junction transistor is formed in which the fourth semiconductor region serves as a gate and in which one of the first and fifth semiconductor regions serves as a drain and the other serves as a source.

6 Claims, 15 Drawing Sheets

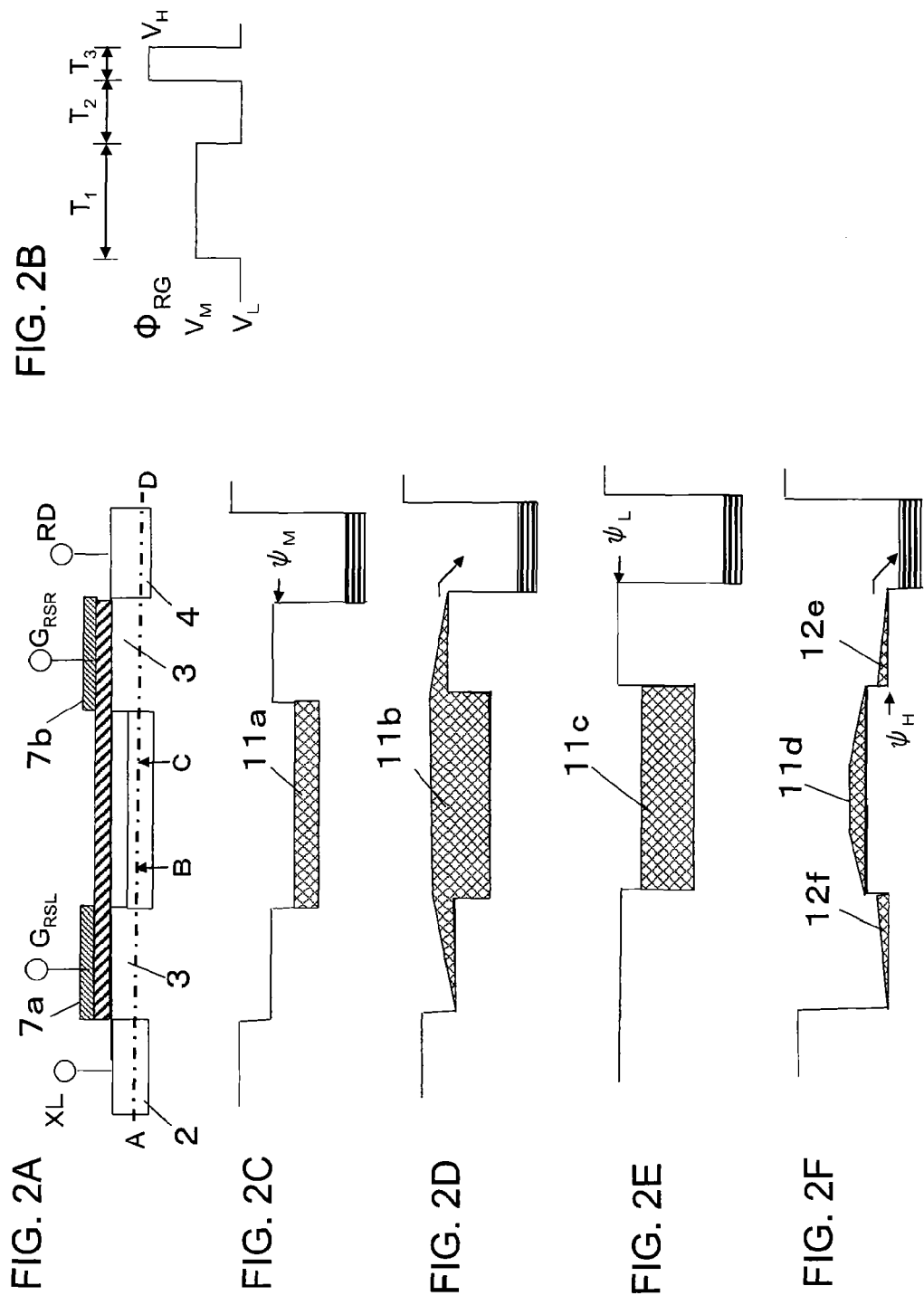

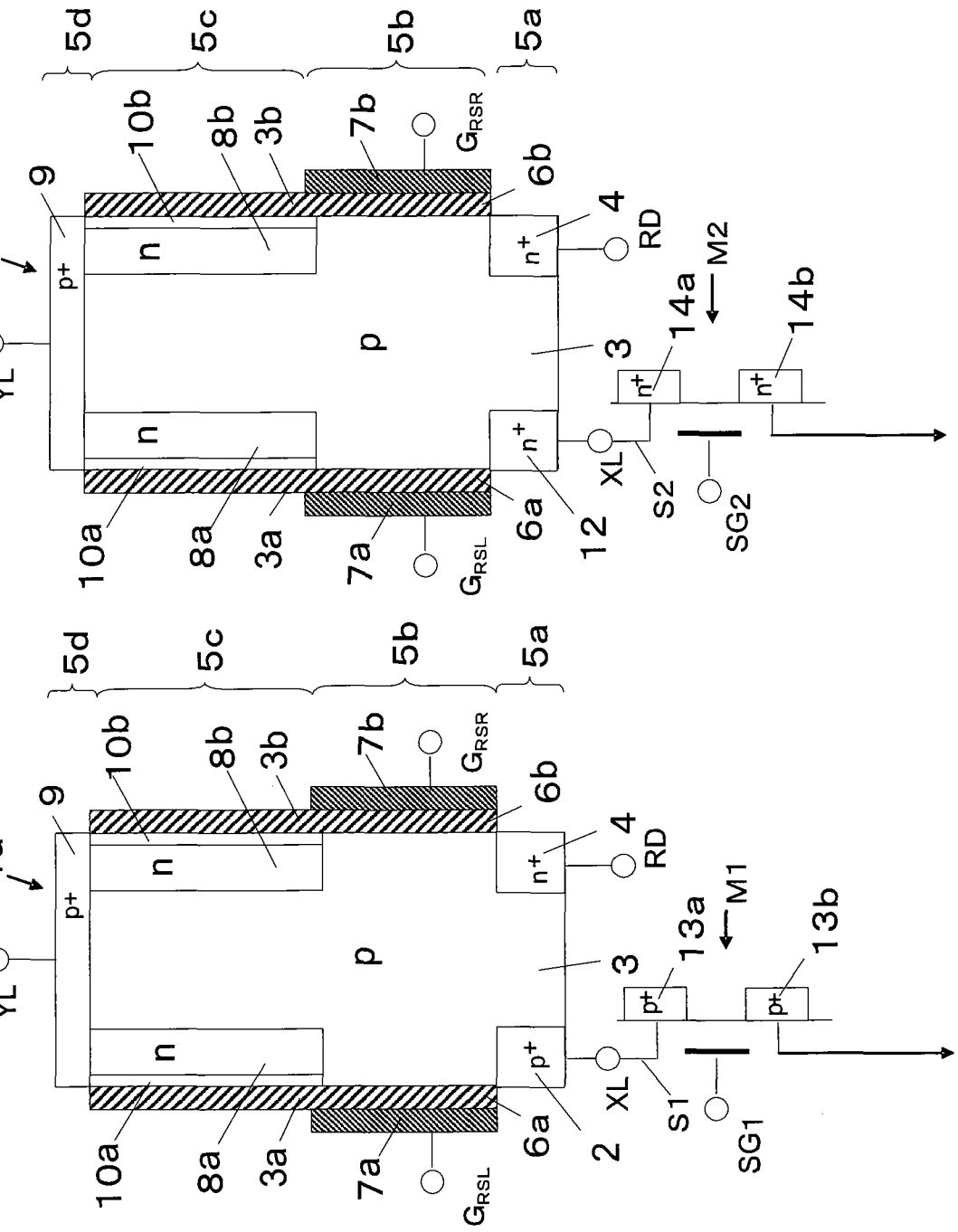
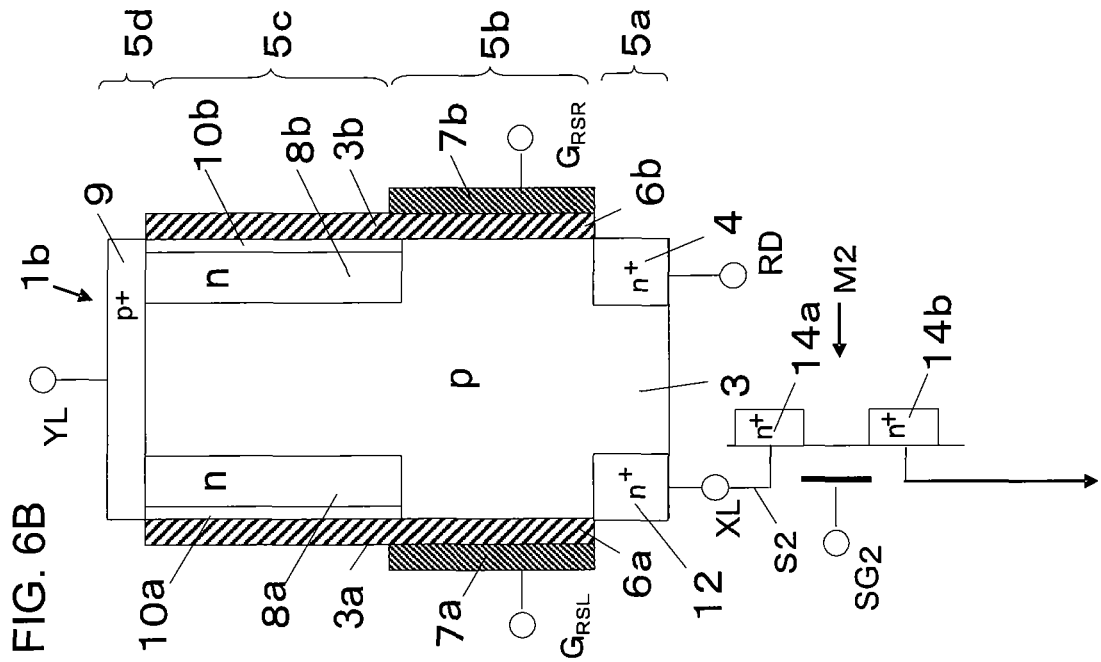

SOLID-STATE IMAGING DEVICE

RELATED APPLICATIONS

Pursuant to 35 U.S.C. §119(e), this application claims the benefit of the filing date of Provisional U.S. Patent Application Ser. No. 61/369,263 filed on Jul. 30, 2010. This application also claims priority under 35 U.S.C. §119(a) to JP2010-173003 filed on Jul. 30, 2010 and JP2010-276403 filed on Dec. 10, 2010. The entire contents of these applications are hereby incorporated by reference.

BACKGROUND OF THE INVENTION

1. Field of the Invention

The present invention relates to solid-state imaging devices, and particularly relates to a high-pixel-density solid-state imaging device that enables expansion of a dynamic range, a high-speed shutter, and a decreased drive voltage.

2. Description of the Related Art

At present, solid-state imaging devices, such as charge-coupled devices (CCDs) and complementary metal-oxide semiconductor (CMOS) devices, are widely used in video cameras, still cameras, and the like. A higher pixel density is demanded for enhancing the performance of solid-state imaging devices, for example, realizing a higher resolution. Also, an improvement in function, such as a high-speed shutter and expansion of a dynamic range, and a lower driving power for reducing power consumption are demanded.

Hereinafter, the structure and operation of a solid-state imaging device according to a related art will be described (for example, International Publication No. 2009/034623). As illustrated in FIG. 11, a pixel is constituted by a single island-shaped semiconductor 20. In this pixel, an n$^+$-type signal wiring layer 21 is formed on a substrate. Also, a metal-oxide semiconductor (MOS) transistor including a p-type semiconductor layer 22, insulating films 23a and 23b, and gate conductive electrodes 24a and 24b is formed in an outer periphery portion of the island-shaped semiconductor 20 that is in contact with the n$^+$-type signal wiring layer 21. The gate conductive electrodes 24a and 24b are ring-shaped so as to surround the island-shaped semiconductor 20 and are electrically connected to each other. Furthermore, in the outer periphery portion of the island-shaped semiconductor 20, a photodiode that is made up of the p-type semiconductor layer 22 and n-type semiconductor layers 25a and 25b and that stores charges generated through exposure to light is formed so as to be in contact with the MOS transistor. Also, a junction transistor is formed in which the p-type semiconductor layer 22 in this photodiode serves as a channel, a p$^+$-type semiconductor layer 26 that is in contact with pixel selection lines 27a and 27b formed on the photodiode serves as a source, and the p-type semiconductor layer 22 near the n$^+$-type signal wiring layer 21 serves as a drain.

Also, the gate conductive electrodes 24a and 24b are electrically connected to reset gate terminals $G_{RSL}$ and $G_{RSR}$, the p$^+$-type semiconductor layer 26 is electrically connected to a pixel selection wiring terminal YL, and the n$^+$-type signal wiring layer 21 is electrically connected to a signal wiring terminal XL.

A basic operation of this solid-state imaging device includes: a "signal charge storage operation" for storing signal charges (in this case, free electrons) generated through exposure to light in the photodiode made up of the p-type semiconductor layer 22 and the n-type semiconductor layers 25a and 25b; a "signal current readout operation" for modulating a source-drain current flowing between the p-type semiconductor layer 22 near the n$^+$-type signal wiring layer 21 and the p$^+$-type semiconductor layer 26 electrically connected to the pixel selection lines 27a and 27b in accordance with the channel width of the junction transistor that increases/decreases on the basis of a photodiode voltage (gate voltage) based on signal charges stored in the photodiode, and reading out the modulated current as a signal current; and a "reset operation" for discharging, after the signal current readout operation, the signal charges stored in the photodiode via the n$^+$-type signal wiring layer 21 serving as a reset drain, by applying an ON voltage (positive voltage) to the gate conductive electrodes 24a and 24b of the MOS transistor.

In this pixel structure, the n$^+$-type signal wiring layer 21 has a function of a signal current readout drain of the junction transistor and a function of a reset drain for discharging signal charges stored in the photodiode via the MOS transistor made up of the p-type semiconductor layer 22, the insulating films 23a and 23b, and the gate conductive electrodes 24a and 24b.

FIG. 12A is a time chart illustrating a waveform $\Phi_{RG}$ of a voltage applied to the reset gate terminals $G_{RSL}$ and $G_{RSR}$, a waveform $\Phi_{YL}$ of a voltage applied to the pixel selection wiring terminal YL, and a waveform $\Phi_{XL}$ of a voltage applied to the signal wiring terminal XL in the above-described MOS transistor.

As illustrated in FIG. 12A, the signal current readout operation is performed by setting, for example, $\Phi_{RG}=V_L$, $\Phi_{YL}=V_H$, and $\Phi_{XL}=V_L$, in which $V_H$ represents a high-level voltage and $V_L$ represents a low-level voltage, in a signal current readout period (ON period of a signal current readout pulse) $T_{RO}$. The reset operation for discharging signal charges stored in the photodiode is performed by setting, for example, $\Phi_{RG}=V_H$, $\Phi_{YL}=V_L$, and $\Phi_{XL}=V_H$, in a reset period (ON period of a reset pulse) $T_{RS}$ that follows the signal current readout period $T_{RO}$. The signal charge storage operation is performed by setting, for example, $\Phi_{RG}=V_L$, $\Phi_{YL}=V_L$, and $\Phi_{XL}=V_L$, in a signal charge storage period $T_S$ that follows the reset period $T_{RS}$. A still image capturing operation is basically made up of one reset operation, one signal charge storage operation, and one signal current readout operation. Also, a moving image capturing operation is performed by repeating the reset operation, signal charge storage operation, and signal current readout operation for individual pixels.

A plurality of pixels, each being the pixel illustrated in FIG. 11, are two-dimensionally arranged in a pixel region of the solid-state imaging device. In the individual pixels, the signal wiring terminals XL and the pixel selection wiring terminals YL thereof are electrically connected to an X-direction (horizontal-direction) scanning circuit and a Y-direction (vertical-direction) scanning circuit disposed around the pixel region. In the pixel region, the individual pixels are sequentially scanned and selected on an XY matrix by the X-direction scanning circuit and the Y-direction scanning circuit, so that pixel signals are read out. In the pixel signal current readout operation, one horizontal pixel column in the X direction is read out, and then one horizontal pixel column adjacent thereto in the Y direction is read out. This operation is repeated, whereby all the pixel signals in the pixel region are read out.

FIG. 12B is a time chart illustrating a horizontal pixel signal current readout period $T_{HR1}$, a horizontal pixel signal current readout period $T_{HR2}$, ..., and a horizontal pixel signal current readout period $T_{HRn}$.

As illustrated in FIG. 12B, a plurality of horizontal pixel signal current readout periods $T_{HR2}$, ..., and $T_{HRn}$ are set after one horizontal pixel signal current readout period $T_{HR1}$. Also, horizontal blanking periods $T_{HB1}$, $T_{HB2}$, ..., and $T_{HBn}$ are set between the respective horizontal pixel signal current readout periods $T_{HR1}, T_{HR2}, \ldots,$ and $T_{HRn}$. In the case of capturing a still image, the operation ends in one frame period from the period $T_{HR1}$ to the period $T_{HRn}$. In the case of capturing a moving image, the operation in one frame period is repeated a plurality of times.

Referring to FIG. 12B, in one frame period (horizontal pixel signal current readout periods $T_{HR1}, T_{HR2}, \ldots,$ and $T_{HRn}$), a signal current readout operation is performed by the junction transistor. In the solid-state imaging device having the pixel configuration according to the related art illustrated in FIG. 11, the n⁺-type signal wiring layer 21 serves as both the signal current readout drain and the reset drain for discharging signal charges stored in the photodiode. Thus, a signal current readout operation and a reset operation of signal charges stored in the photodiode cannot be performed at the same time.

Also, control of a shutter period is performed by changing the signal charge storage period $T_S$, which is a signal charge readout period between the reset period $T_{RS}$ and the signal current readout period $T_{RO}$.

In the solid-state imaging device having the pixel configuration according to the related art illustrated in FIG. 11, the n⁺-type signal wiring layer 21 serves as both the signal current readout drain of the junction transistor and the reset drain for discharging signal charges stored in the photodiode. Thus, in the MOS transistor made up of the p-type semiconductor layer 22, the insulating films 23a and 23b, and the gate conductive electrodes 24a and 24b, a low-level voltage $V_L$ is applied to the gate conductive electrodes 24a and 24b of the MOS transistor in the signal charge storage period $T_S$ so that the signal charges stored in the photodiode do not leak into the n⁺-type signal wiring layer 21. Accordingly, as illustrated in FIG. 13, in a photoelectric conversion characteristic representing the relationship between a light intensity L (the amount of incident light) to which the pixel is exposed and an output voltage Vout, the output voltage Vout monotonically increases in accordance with an increase in the light intensity L and is saturated in a certain level (saturation output level Vout1) at a light intensity $L_1$. In this case, it is necessary to increase the area of the photodiode by extending the length of the island-shaped semiconductor forming a pixel or to increase a drive voltage in order to expand the dynamic range represented by the ratio between a noise level and the saturation output level Vout1. If the length of the island-shaped semiconductor is extended, a deep portion from a silicon pillar forming the island-shaped semiconductor 20 needs to be precisely processed, and thus it becomes difficult to manufacture the solid-state imaging device. Furthermore, an increase in drive voltage causes an increase in power consumption, which is undesirable.

Also, in the solid-state imaging device illustrated in FIG. 11, the n⁺-type signal wiring layer 21 serves as both the signal current readout drain of the junction transistor and the reset drain for discharging signal charges stored in the photodiode. Thus, when a signal current readout operation by the junction transistor is being performed in one pixel connected to a certain signal line via the n⁺-type signal wiring layer 21, a reset operation of discharging the signal charges stored in the photodiode cannot be performed in another pixel connected to the same signal line. This decreases the degree of freedom for changing the signal charge storage period $T_S$, which is a signal charge readout period between the reset period $T_{RS}$ and the signal current readout period $T_{RO}$, so that the controllability of a shutter period degrades. Here, a shutter operation can be performed at higher speed as the signal charge storage period $T_S$ is shorter.

Also, in the solid-state imaging device illustrated in FIG. 11, readout of a signal current by the junction transistor is performed by applying a high-level voltage $V_H$ to the p⁺-type semiconductor layer 26 electrically connected to the pixel selection lines 27a and 27b via the pixel selection wiring terminal YL and by applying a low-level voltage $V_L$ to the n⁺-type signal wiring layer 21 electrically connected to the signal line via the signal wiring terminal XL. In this case, a pn diode formed of the p-type semiconductor layer 22 serving as a channel and the n⁺-type signal wiring layer 21 is brought into a forward bias state. Thus, in order to operate the junction transistor in a forward current condition with a sufficiently low resistance, it is necessary to apply a voltage of at least 0.7 V or more between the p⁺-type semiconductor layer 26 electrically connected to the pixel selection wiring terminal YL and the n⁺-type signal wiring layer 21 so that the forward resistance of a PN junction is sufficiently low. In this case, drive is performed on a higher-voltage side by 0.7 V with respect to the voltage that is necessary for operating an ordinary junction transistor having no PN junction. This is undesirable in terms of decreasing power consumption of the solid-state imaging device.

SUMMARY OF THE INVENTION

The present invention has been made in view of the above-described circumstances, and provides a high-pixel-density solid-state imaging device that enables expansion of a dynamic range, a high-speed shutter, and a decreased drive voltage.

According to an aspect of the present invention, there is provided a solid-state imaging device in which a plurality of pixels are arranged in a pixel region. Each of the plurality of pixels includes: a first semiconductor tier formed on a substrate and having a first semiconductor region, a second semiconductor region that is in contact with the first semiconductor region, and a third semiconductor region that is in contact with the second semiconductor region and that is not in contact with the first semiconductor region; a second semiconductor tier formed on the first semiconductor tier and having the second semiconductor region and conductive electrodes that are formed in an outer periphery portion of the second semiconductor region, with insulating films interposed between the second semiconductor region and the conductive electrodes; a third semiconductor tier formed on the second semiconductor tier and having the second semiconductor region and a fourth semiconductor region that is formed in an outer periphery portion of the second semiconductor region; and a fourth semiconductor tier formed on the third semiconductor tier and having a fifth semiconductor region that is in contact with the second semiconductor region. The second semiconductor region and the fourth semiconductor region in the third semiconductor tier form a photodiode that stores signal charges generated in the pixel through exposure to electromagnetic energy waves. The fourth semiconductor region, which functions as a gate, the second semiconductor region, which functions as a channel, and the first semiconductor region and the fifth semiconductor region, one of which functions as a drain and the other of which functions as a source, form a junction transistor that reads out a pixel signal by measuring a signal current that changes in accordance with an amount of signal charges stored in the photodiode. The conductive electrodes, which function as a gate, the second semiconductor region, which functions as a channel, and the third semiconductor region, which functions as a drain, form a MOS transistor that discharges the signal charges stored in the photodiode to the third semiconductor region. The first semiconductor region is electrically connected to a first external circuit disposed outside the pixel region. The third semiconductor region is electrically connected to a second external circuit disposed outside the pixel region. The conductive electrodes are electrically connected to a third external circuit disposed outside the pixel region. The fifth semiconductor region is electrically connected to a fourth external circuit disposed outside the pixel region. At least the third semiconductor tier and the fourth semiconductor tier form an island-shaped structure.

Preferably, the first semiconductor region and the fifth semiconductor region are of the same conductivity type, the second semiconductor region is of the same conductivity type as the first semiconductor region or of a substantially intrinsic type, and the third semiconductor region and the fourth semiconductor region are of a conductivity type opposite to the conductivity type of the first semiconductor region.

Preferably, the MOS transistor discharges signal charges to the third semiconductor region without leaking the signal charges to the first semiconductor region by applying a voltage that temporally changes to the conductive electrodes during a period for storing the signal charges in the photodiode.

Preferably, each of the plurality of pixels further includes a fifth semiconductor tier that is band-shaped and that is orthogonal to a direction in which a wiring line for electrically connecting the fifth semiconductor region and the fourth external circuit extends, the fifth semiconductor tier being formed between the substrate and the first semiconductor tier. The fifth semiconductor tier preferably includes a sixth semiconductor region that is connected to the first semiconductor region and that is of the same conductivity type as the first semiconductor region, a seventh semiconductor region that is connected to the second semiconductor region and that is of the same conductivity type as the second semiconductor region, and an eighth semiconductor region that is connected to the third semiconductor region and that is of the same conductivity type as the third semiconductor region.

Preferably, both the first semiconductor tier and the second semiconductor tier are formed in a band shape by being integrated with the fifth semiconductor tier. In the fifth semiconductor tier, the sixth semiconductor region is integrated with the first semiconductor region, and the eighth semiconductor region is integrated with the third semiconductor region. The conductive electrodes of the MOS transistor are electrically isolated from each other on a side of a portion where the sixth semiconductor region in the fifth semiconductor tier is integrated with the first semiconductor region and on a side of a portion where the eighth semiconductor region in the fifth semiconductor tier is integrated with the third semiconductor region.

Preferably, a MOS transistor in the first external circuit is electrically connected to the first semiconductor region, and a source and a drain of the MOS transistor are formed of a semiconductor of the same conductivity type as the first semiconductor region.

According to the present invention, a high-pixel-density solid-state imaging device that enables expansion of a dynamic range, a high-speed shutter, and a decreased drive voltage can be provided.

BRIEF DESCRIPTION OF THE DRAWINGS

FIG. 2A illustrates a pixel structure for describing an operation of expanding a dynamic range performed by a solid-state imaging device according to a second embodiment, FIG. 2B illustrates the waveform of an applied voltage in the operation of expanding a dynamic range performed by the solid-state imaging device, and FIGS. 2C to 2F are potential distribution diagrams in the operation of expanding a dynamic range performed by the solid-state imaging device.

FIG. 6A is a diagram for describing a relationship between the structure of a pixel in a solid-state imaging device according to a fifth embodiment and a MOS transistor serving as an external circuit connected to the pixel, and FIG. 6B is a diagram for describing a relationship between the structure of a pixel in the solid-state imaging device and a MOS transistor serving as an external circuit connected to the pixel.

DETAILED DESCRIPTION OF THE PREFERRED EMBODIMENTS

Hereinafter, embodiments of the present invention will be described with reference to the drawings. Note that the present invention is not limited by the embodiments described below.

First Embodiment

Figure 1A:
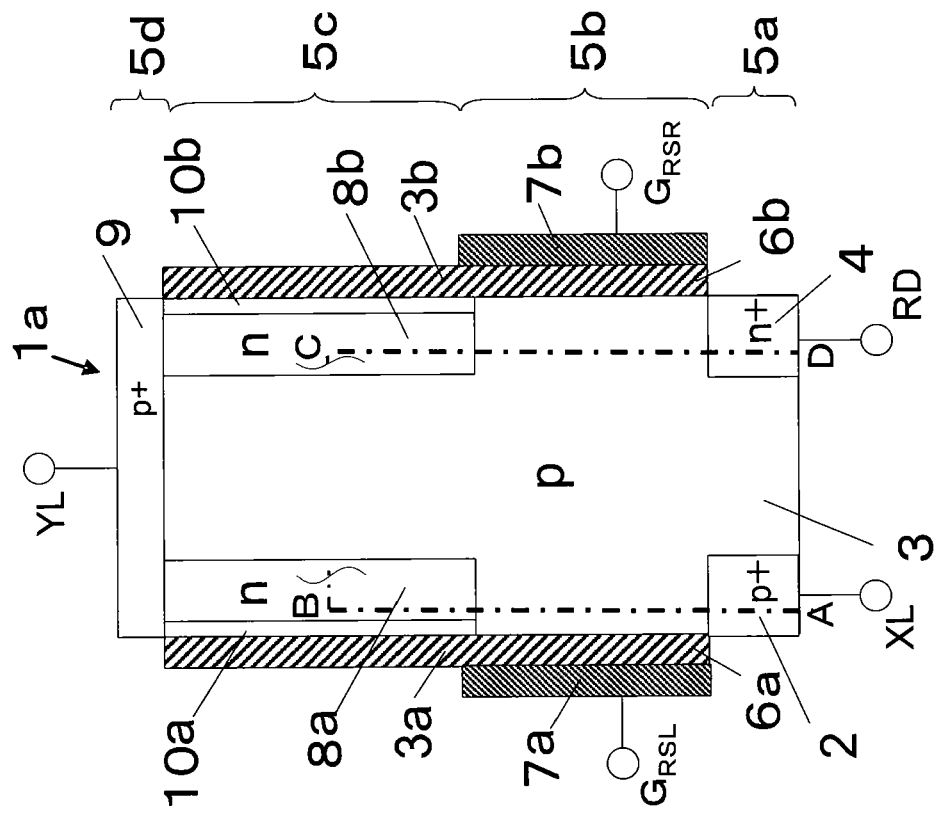
FIG. 1A is a schematic cross-sectional view illustrating the structure of a pixel in a solid-state imaging device according to a first embodiment.

FIG. 1A illustrates the structure of a pixel 1a in a solid-state imaging device according to a first embodiment of the present invention. As illustrated in FIG. 1A, the pixel 1a is formed so as to be a single island-shaped semiconductor.

The pixel 1a includes a first semiconductor tier 5a having a first p$^+$-type semiconductor region 2 electrically connected to a signal wiring terminal XL formed on a substrate, a p-type semiconductor region 3 that is in contact with the first p$^+$-type semiconductor region 2, and an n$^+$-type semiconductor region 4 that is in contact with the p-type semiconductor region 3 and that is electrically connected to a reset drain terminal RD.

The p-type semiconductor region 3 is formed on the first semiconductor tier 5a so as to expand from the first semiconductor tier 5a. The p-type semiconductor region 3 that is formed in an expanded manner on the first semiconductor tier 5a, insulating films 6a and 6b that are formed to surround the outer periphery portion of the p-type semiconductor region 3, and gate conductive electrodes 7a and 7b electrically connected to reset gate terminals G$_{RSL}$ and G$_{RSR}$, respectively, form a MOS transistor. The gate conductive electrodes 7a and 7b are electrically connected to each other so as to surround the insulating films 6a and 6b. Also, a second semiconductor tier 5b having this MOS transistor is formed on the first semiconductor tier 5a.

Also, the p-type semiconductor region 3 is formed on the second semiconductor tier 5b so as to expand from the second semiconductor tier 5b. Also, n-type semiconductor regions 8a and 8b are formed in the outer periphery portion of the p-type semiconductor region 3 that is formed in an expanded manner on the second semiconductor tier 5b. The n-type semiconductor regions 8a and 8b and the p-type semiconductor region 3 that is formed in an expanded manner on the second semiconductor tier 5b form a photodiode. Also, a third semiconductor tier 5c having this photodiode is formed on the second semiconductor tier 5b.

Furthermore, a fourth semiconductor tier 5d having a second p$^+$-type semiconductor region 9 that is electrically connected to a pixel selection wiring terminal YL is formed on the third semiconductor tier 5c. In this embodiment, at least the third semiconductor tier 5c and the fourth semiconductor tier 5d are formed in the island-shaped structure in this way.

In the third semiconductor tier 5c, third p$^+$-type semiconductor regions 10a and 10b electrically connected to the second p$^+$-type semiconductor region 9 are formed between the n-type semiconductor regions 8a and 8b and the insulating films 6a and 6b. A plurality of pixels 1a are arranged two-dimensionally in a pixel region of the solid-state imaging device. The signal wiring terminals XL, the reset drain terminals RD, the reset gate terminals G$_{RSL}$ and G$_{RSR}$, and the pixel selection wiring terminals YL thereof are electrically connected to driving circuits (X-direction (horizontal-direction) scanning circuit, Y-direction (vertical-direction) scanning circuit, and the like) or a signal current readout circuit outside the pixel region (see FIG. 1C).

Here, referring to FIG. 1A, a junction transistor is formed in which the second p$^+$-type semiconductor region 9 electrically connected to the pixel selection wiring terminal YL functions as a source, the first p$^+$-type semiconductor region 2 electrically connected to the signal wiring terminal XL functions as a drain, and the n-type semiconductor regions 8a and 8b of the photodiode function as a gate.

The pixel region of the solid-state imaging device is exposed to light in a signal charge storage period T$_S$ (see FIG. 12A) when light enters through the second p$^+$-type semiconductor region 9 electrically connected to the pixel selection wiring terminal YL. In this period, signal charges (in this case, free electrons) generated by a photoelectric effect are stored in the photodiode made up of the n-type semiconductor regions 8a and 8b and the p-type semiconductor region 3 that is formed in the third semiconductor tier 5c and on the second semiconductor tier 5b in an expanded manner (signal charge storage operation). In the signal charge storage period T$_S$, a low-level off voltage is applied to the gate conductive electrodes 7a and 7b of the above-described MOS transistor.

A photodiode voltage (gate voltage) that is applied to the n-type semiconductor regions 8a and 8b changes in accordance with the amount of signal charges stored in the photodiode. The channel width of the junction transistor is increased/decreased by the photodiode voltage. Then, a signal current flowing between the first p$^+$-type semiconductor region 2 and the second p$^+$-type semiconductor region 9 (between the drain and source) of the junction transistor changes, and the signal current is read out as a pixel signal by an output circuit 204 (see FIG. 1C) from the signal wiring terminal XL (signal current readout operation). Then, the signal charges stored in the photodiode are discharged via the n$^+$-type semiconductor region 4 serving as a reset drain, by applying a high-level ON voltage (positive voltage) to the gate conductive electrodes 7a and 7b of the MOS transistor (reset operation).

In the first embodiment, the third p$^+$-type semiconductor regions 10a and 10b are provided for reducing the generation of dark current in the photodiode made up of the n-type semiconductor regions 8a and 8b and the p-type semiconductor region 3 formed in the third semiconductor tier 5c and on the second semiconductor tier 5b in an expanded manner, and for suppressing an afterimage and noise that occur when discharging the signal charges stored in this photodiode to the n$^+$-type semiconductor region 4 serving as a reset drain.

As described above, in the solid-state imaging device according to the first embodiment, readout of a signal current flowing between the source and drain of the junction transistor (signal current readout operation) is performed from the first p$^+$-type semiconductor region 2, and discharge of signal charges stored in the photodiode (reset operation) is performed from the n$^+$-type semiconductor region 4. Accordingly, even in a period when one pixel electrically connected to a certain signal line via the first p$^+$-type semiconductor region 2 is performing a signal readout operation, a reset operation can be performed in another pixel electrically connected to the same signal line via the first p$^+$-type semiconductor region 2.

Figure 11:
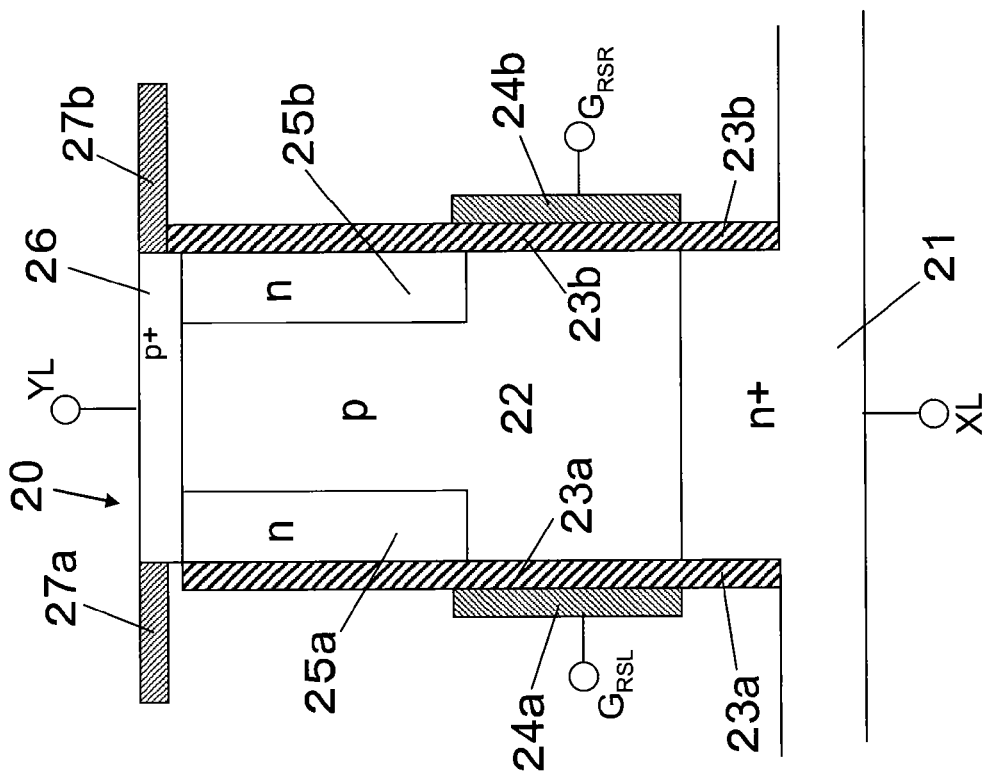
FIG. 11 is a schematic cross-sectional view illustrating the structure of a pixel in a solid-state imaging device according to a related art.
Figure 12A:
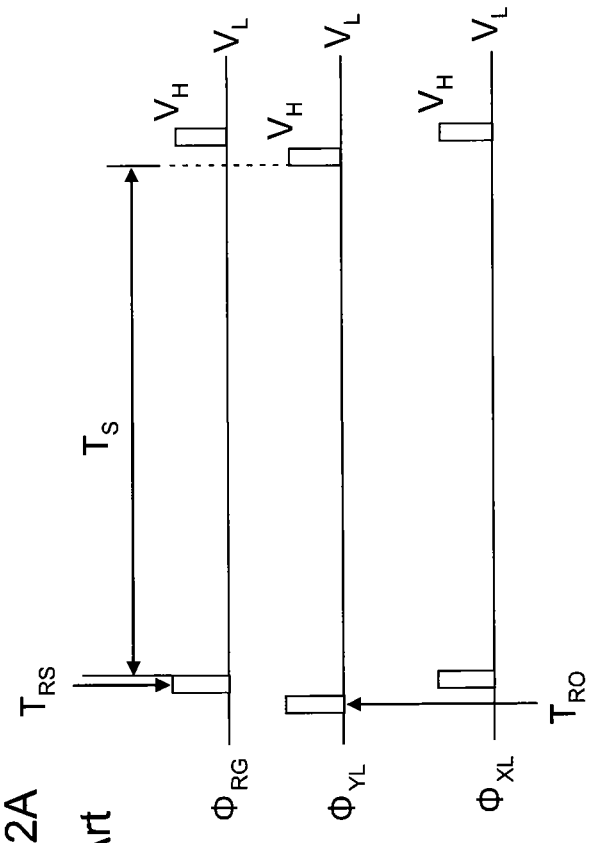
FIG. 12A is a diagram illustrating the waveform of an applied voltage in the solid-state imaging device according to the related art.
Figure 12B:
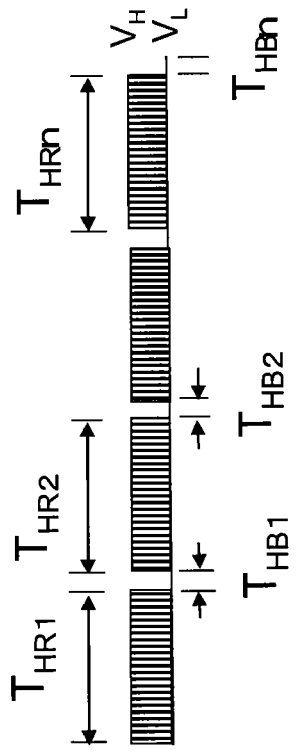
FIG. 12B is a diagram illustrating a horizontal pixel signal current readout period in the solid-state imaging device according to the related art.

In the solid-state imaging device according to the related art illustrated in FIG. 11, a low-level voltage V$_L$ is applied to the gate conductive electrodes 24a and 24b of the MOS transistor so that the signal charges stored in the photodiode do not leak into the n$^+$-type signal wiring layer 21 electrically connected to the signal line in the signal charge storage period T$_S$ and the signal current readout period T$_{RO}$ (see FIG. 12A). Therefore, the voltage applied to the gate conductive electrodes 24a and 24b cannot be temporally changed in the signal charge storage period T$_S$. In contrast, in the solid-state imaging device according to the first embodiment, the n$^+$-type semiconductor region 4 is electrically connected to a wiring line different from the signal line (reset drain wiring line), and thus a reset operation can be performed by applying a high-level voltage that temporally changes to the gate conductive electrodes 7a and 7b even in the signal charge storage period T$_S$. Accordingly, the signal charges stored in the photodiode can be discharged to the n$^+$-type semiconductor region 4 without leakage into the first p$^+$-type semiconductor region 2. This increases the degree of freedom of changing the signal charge storage period T$_S$, which is a signal charge readout period between the reset period $T_{RS}$ and the signal current readout period $T_{RO}$, thereby improving the controllability of a shutter period.

In the solid-state imaging device according to the first embodiment, the drain of the junction transistor is the first p$^+$-type semiconductor region 2 electrically connected to the signal line via the signal wiring terminal XL, and thus there is no pn diode formed of the p-type semiconductor layer 22 and the n$^+$-type signal wiring layer 21 electrically connected to the signal line, unlike in the solid-state imaging device according to the related art illustrated in FIG. 11. Thus, an applied voltage of 0.7 V, which is necessary to operate the pn diode in a forward current condition with sufficiently low resistance, is not necessary unlike in the solid-state imaging device according to the related art. Accordingly, in the solid-state imaging device, a lower drive voltage is realized and lower power consumption is achieved.

Figure 1B:
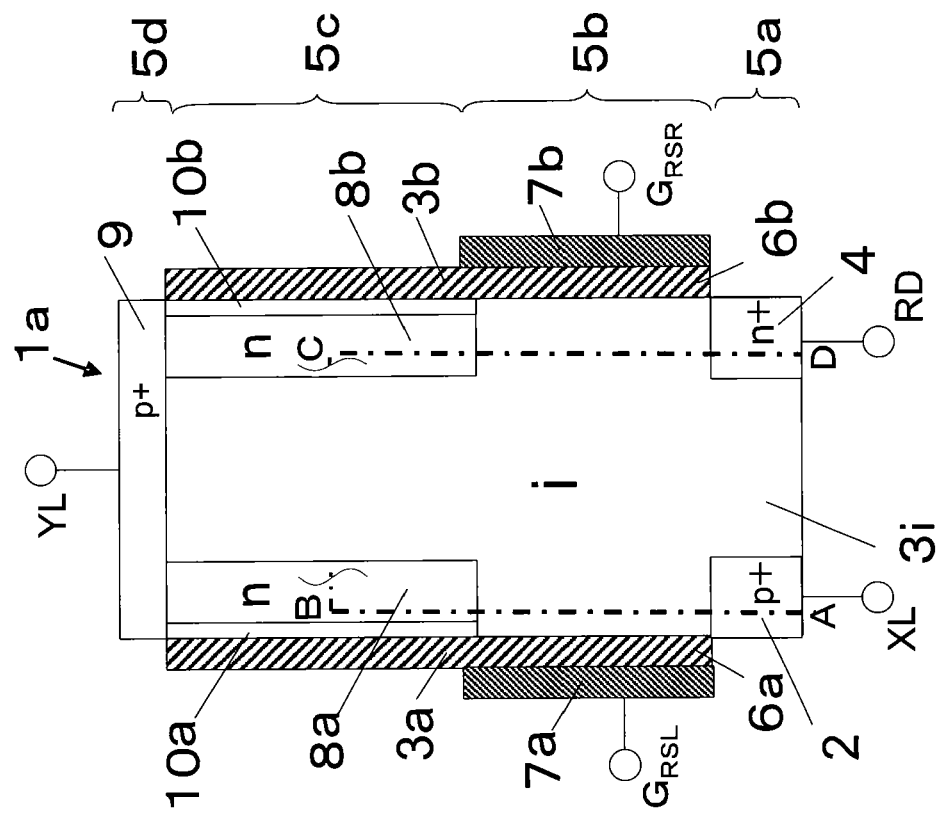
FIG. 1B is a schematic cross-sectional view illustrating the structure of a pixel in a solid-state imaging device according to a modification of the first embodiment.

In the solid-state imaging device illustrated in FIG. 1A, the conductivity type of the p-type semiconductor region 3 is p-type. The p-type semiconductor region 3 may be replaced by an intrinsic semiconductor region 3i that is substantially made up of an intrinsic semiconductor, as illustrated in FIG. 1B. The intrinsic semiconductor is made so as to prevent the mixture of impurities, but inevitably contains a very small amount of impurity in an actual case. The intrinsic semiconductor region 3i may contain a small amount of acceptor or donor impurity if the amount does not degrade the function of the solid-state imaging device. According to the configuration illustrated in FIG. 1B, the n-type semiconductor regions 8a and 8b and the intrinsic semiconductor region 3i form a photodiode. Also, when a sufficient voltage is applied between the second p$^+$-type semiconductor region 9 and the first p$^+$-type semiconductor region 2, holes in the second p$^+$-type semiconductor region 9 flow into the first p$^+$-type semiconductor region 2 due to potential gradient that occurs in the intrinsic semiconductor region 3i. In this way, the intrinsic semiconductor region 3i also functions as a channel of a junction transistor.

Figure 1C:
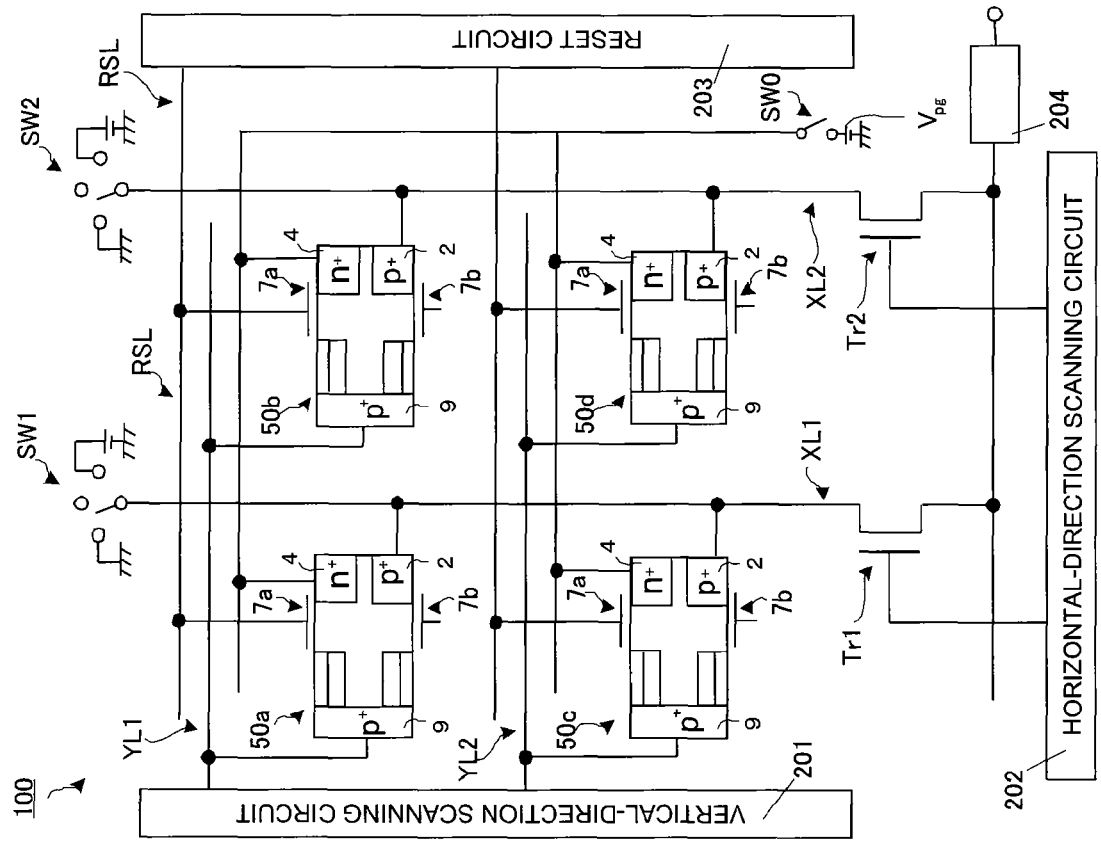
FIG. 1C is an example of a circuit configuration diagram of the solid-state imaging device according to the first embodiment.

FIG. 1C illustrates an example circuit configuration of a solid-state imaging device 100 according to the first embodiment. The solid-state imaging device 100 mainly includes a plurality of (four) pixels 50a to 50d arranged in a two-dimensional matrix, a vertical-direction scanning circuit 201, a horizontal-direction scanning circuit 202, a reset circuit 203, pixel selection lines YL1 and YL2, signal lines XL1 and XL2, reset lines RSL, signal line MOS transistors Tr1 and Tr2, and an output circuit 204. The pixels 50a to 50d have a configuration similar to that of the pixel 1a according to the first embodiment and operate similarly.

Here, a case where the pixels 50a to 50d are arranged in two rows and two columns is illustrated. However, the solid-state imaging device according to the present invention is not limited thereto, and expansion to n rows and m columns other than two rows and two columns (n≧2, m≧2) can be of course accepted.

As illustrated in FIG. 1C, the vertical direction scanning line 201, which inputs pixel selection signals to the second p$^+$-type semiconductor regions 9 of the individual pixels 50a to 50d, is electrically connected to the individual pixels 50a to 50d in the respective rows via the pixel selection lines YL1 and YL2. Also, in the individual pixels 50a to 50d, the first p$^+$-type semiconductor regions 2 are electrically connected to the output circuit 204 in the respective columns via the signal lines XL1 and XL2, and the n$^+$-type semiconductor regions 4 are electrically connected to a reset drain direct current (DC) power supply Vpg via a switch SW0. The gate electrodes of the signal line MOS transistors Tr1 and Tr2 disposed in the respective signal lines XL1 and XL2 are electrically connected to the horizontal-direction scanning circuit 202, which inputs signal line selection signals for selecting signal lines to the gate electrodes. The signal lines XL1 and XL2 are electrically connected to switches SW1 and SW2, respectively. The gate conductive electrodes 7a and 7b of the reset MOS transistors used for a reset operation are electrically connected to the reset circuit 203, which inputs reset signals to the gate conductive electrodes 7a and 7b, via the reset lines RSL. In accordance with the operation of the vertical-direction scanning circuit 201 and the horizontal-direction scanning circuit 202 having the above-described configuration, signal currents of the individual pixels 50a to 50d are sequentially read out from the output circuit 204 (signal current readout operation). Also, in accordance with the operation of the reset circuit 203 and an on operation of the switch SW0 electrically connected to the reset drain DC power supply Vpg, the signal charges stored in the photodiodes are discharged (reset operation).

Second Embodiment

Hereinafter, an operation of expanding a dynamic range performed by a solid-state imaging device according to a second embodiment of the present invention will be described with reference to FIG. 2A to FIG. 2F. The solid-state imaging device according to this embodiment has the same configuration as that of the solid-state imaging device according to the first embodiment.

FIG. 2A illustrates a cross-sectional view of a pixel along the A-B-C-D line in FIG. 1A. The B-C line in FIG. 2A is based on that the n-type semiconductor regions 8a and 8b of the photodiode are ring-shaped along the outer periphery portion of the third semiconductor tier 5c formed in an island shape. Also, the gate conductive electrode 7a and the gate conductive electrode 7b are ring-shaped so as to surround the island-shaped semiconductor 20 and are electrically connected to each other.

FIG. 2B illustrates a waveform $\Phi_{RG}$ of a voltage applied to the gate conductive electrodes 7a and 7b. Here, a low-level voltage is represented by $V_L$, a middle-level voltage is represented by $V_M$, and a high-level voltage is represented by $V_H$. Assume that $\Phi_{RG}=V_M$ in a first signal charge storage period $T_1$ where signal charges generated through exposure to light are stored in the photodiode, and $\Phi_{RG}=V_L$ in a second signal charge storage period $T_2$. In the final stage of the second signal charge storage period $T_2$, a signal current readout operation is performed in which a signal current flowing between the drain and source (between the first p$^+$-type semiconductor region 2 and the second p$^+$-type semiconductor region 9) of the junction transistor is read out. In a reset period $T_3$ where the signal charges are discharged from the photodiode to the n$^+$-type semiconductor region 4 serving as a reset drain, the reset period $T_3$ following the first signal charge storage period $T_1$ and the second signal charge storage period $T_2$, $\Phi_{RG}=V_H$ is applied to the gate conductive electrodes 7a and 7b. Here, in the individual periods $T_1$, $T_2$, and $T_3$, the first p$^+$-type semiconductor region 2 electrically connected to the signal line is set to the low-level voltage $V_L$, and the n$^+$-type semiconductor region 4 serving as a reset drain is set to the high-level voltage $V_H$.

FIG. 2C to FIG. 2F illustrate a potential distribution of the pixel along the A-B-C-D line in the above-described individual periods $T_1$, $T_2$, and $T_3$.

First, as illustrated in FIG. 2C, in an initial period in the first signal charge storage period $T_1$, signal charges (free electrons) 11a generated through exposure to light are stored in the n-type semiconductor regions 8a and 8b of the photodiode. In this period, the channel potential of the p-type semiconductor region 3 below the gate conductive electrodes 7a and 7b is a middle-level potential $\psi_M$ (the voltage applied to the gate conductive electrodes 7a and 7b in this period=middle-level voltage $V_M$). In this state, the amount of the signal charges 11a stored in the photodiode gradually increases in accordance with exposure to light.

Subsequently, as illustrated in FIG. 2D, when the light intensity becomes higher than a certain threshold level, the channel potential of the p-type semiconductor region 3 below the gate conductive electrodes 7a and 7b exceeds the middle-level potential $\psi_M$, so that part of the stored signal charges 11b, that is, an excess portion of the signal charges 11b, is discharged to the n$^+$-type semiconductor region 4 serving as a reset drain. In this state, the amount of the signal charges 11b stored in the photodiode does not increase even if the light intensity L becomes higher than a certain light intensity Lk (see FIG. 3).

Subsequently, as illustrated in FIG. 2E, in the second signal charge storage period $T_2$, the channel potential of the p-type semiconductor region 3 below the gate conductive electrodes 7a and 7b is a low-level potential $\psi_L$ (the voltage applied to the gate conductive electrodes 7a and 7b in this period=low-level voltage $V_L$), whereby the potential of the channel potential with respect to the signal charges decreases, so that stored signal charges 11c are stored in the photodiode without being discharged to the n$^+$-type semiconductor region 4 serving as a reset drain.

Subsequently, as illustrated in FIG. 2F, in the rest period $T_3$, the channel potential of the p-type semiconductor region 3 below the gate conductive electrodes 7a and 7b is a high-level potential $\psi_H$ (the voltage applied to the gate conductive electrodes 7a and 7b is $V_H$), whereby the potential of the channel potential with respect to the signal charges increases, so that signal charges 11d and 12e stored in the photodiode are discharged to the n$^+$-type semiconductor region 4 serving as a reset drain. In FIG. 2F, it looks like that signal charges 12f stored in the photodiode are transferred to the channel of the p-type semiconductor region 3 below the gate conductive electrode 7a and are not transferred to the n$^+$-type semiconductor region 4 serving as a reset drain. However, the gate conductive electrodes 7a and 7b are ring-shaped so as to surround the outer periphery of the second semiconductor tier 5b and are electrically connected to each other, and thus actually the signal charges 12f are transferred to the channel of the p-type semiconductor region 3 below the gate conductive electrode 7b and is discharged to the n$^+$-type semiconductor region 4 serving as a reset drain.

Figure 3:
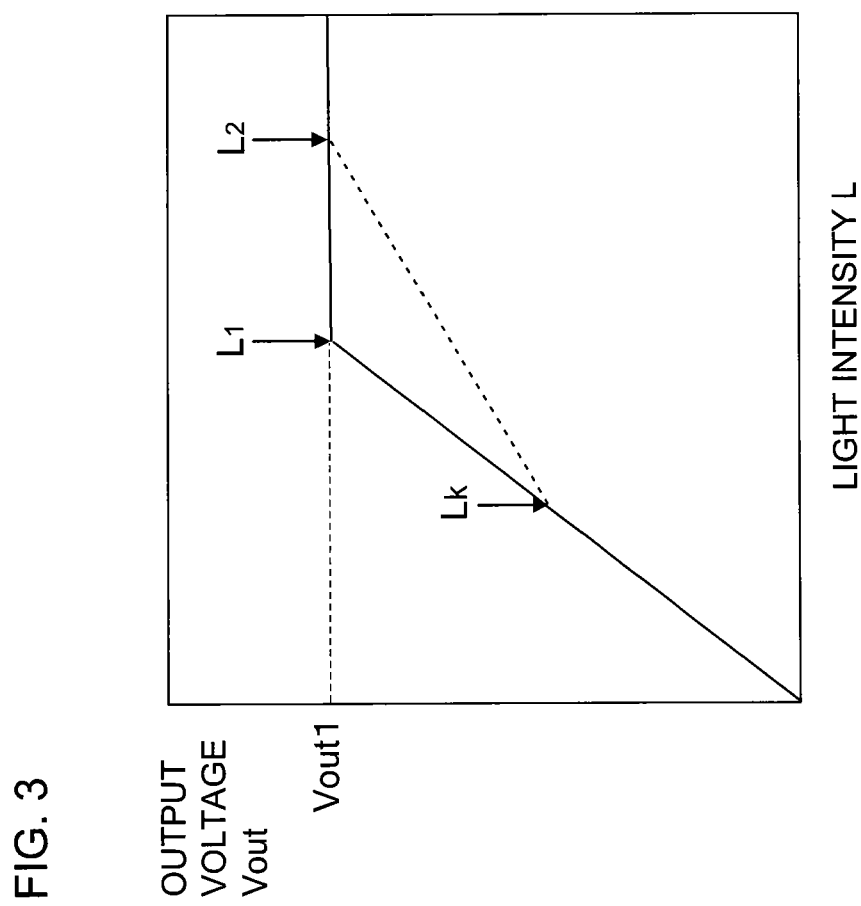
FIG. 3 is a diagram illustrating a relationship between a light intensity L obtained through the operation of expanding a dynamic range performed by the solid-state imaging device according to the second embodiment and an output voltage Vout.
Figure 13:
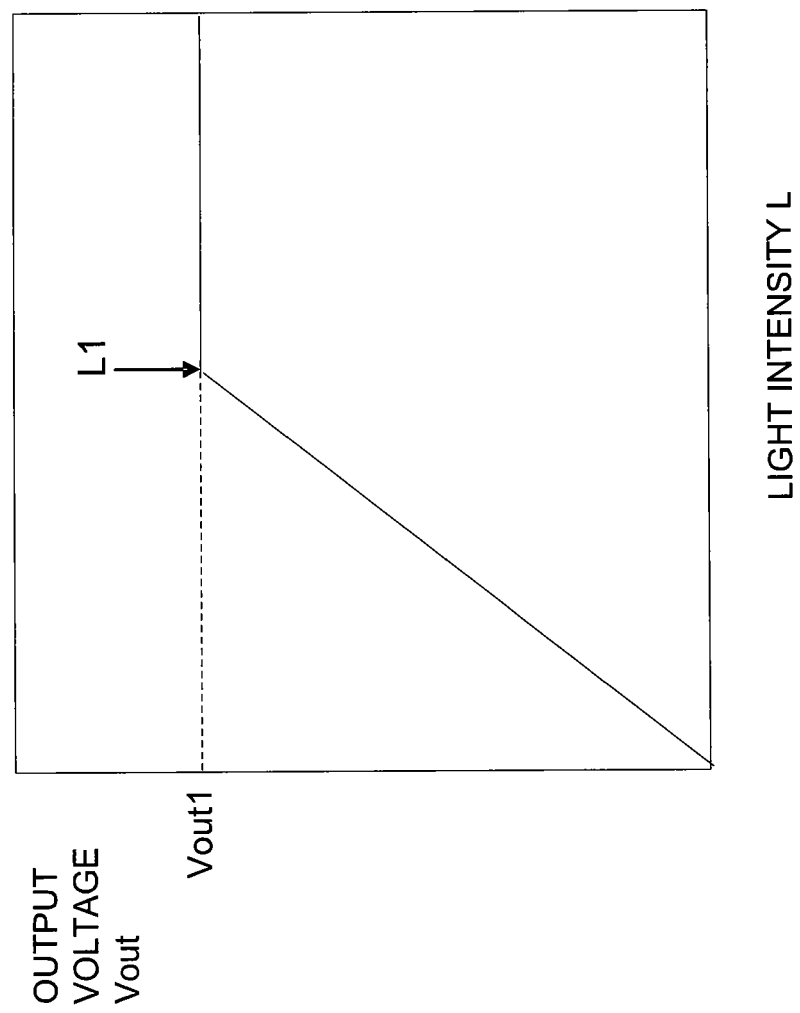
FIG. 13 is a diagram illustrating a relationship between a light intensity L and an output voltage Vout in the solid-state imaging device according to the related art.

FIG. 3 illustrates the relationship between the light intensity L of light to which the solid-state imaging device according to the second embodiment is exposed and the output voltage Vout, obtained in the operation described above with reference to FIG. 2A to FIG. 2F. The solid-state imaging device according to the related art has a characteristic in which the output voltage Vout increases in accordance with the light intensity L until the light intensity L reaches light intensity $L_1$ (see FIG. 13). In contrast, in the solid-state imaging device according to the second embodiment, if the light intensity L becomes higher than the light intensity Lk, an increase in signal charges stored in the photodiode stops due to the operation illustrated in FIG. 2D, and thus the output voltage Vout at the light intensity L higher than the light intensity Lk is lower than that in the solid-state imaging device according to the related art illustrated in FIG. 11 in the region from the light intensity Lk to the light intensity $L_2$ (light intensity Lk<light intensity $L_1$<light intensity $L_2$).

Then, referring to FIG. 2E, in the second signal charge storage period $T_2$, signal charges are stored in the photodiode until the amount thereof reaches the amount corresponding to the saturation level (saturation output level Vout1) that is the same as in the solid-state imaging device according to the related art. Accordingly, the saturation level of the light intensity L is extended to the light intensity $L_2$. This is realized by the first p$^+$-type semiconductor region 2 electrically connected to the signal line being at the low-level voltage $V_L$, and the n$^+$-type semiconductor region 4 serving as a reset drain being set to the high-level voltage $V_H$, that is, to a voltage different from the voltage of the first p$^+$-type semiconductor region 2. Accordingly, referring to FIG. 3, a readout amount of signal current with respect to noise having a light intensity between the light intensity Lk and the light intensity $L_2$ decreases. As a result, the dynamic range is expanded when the noise level is the same.

Third Embodiment

Hereinafter, a high-speed shutter operation performed by a solid-state imaging device according to a third embodiment of the present invention will be described with reference to FIG. 4. This solid-state imaging device has the same configuration as that of the solid-state imaging device according to the first embodiment.

Figure 4:
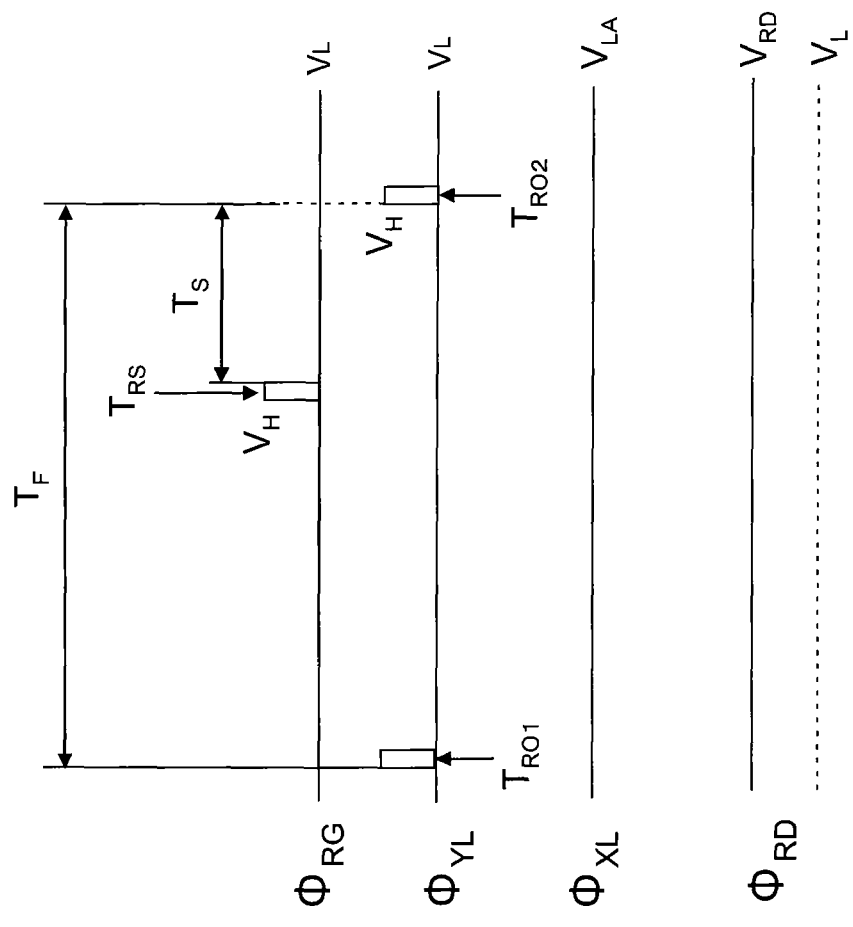
FIG. 4 illustrates the waveform of an applied voltage for describing a high-speed shutter operation performed by a solid-state imaging device according to a third embodiment.

FIG. 4 illustrates a waveform $\Phi_{RG}$ of a voltage applied to the gate conductive electrodes 7a and 7b, a waveform $\Phi_{YL}$ of a voltage applied to the second p$^+$-type semiconductor region 9 electrically connected to the pixel selection line, a waveform $\Phi_{XL}$ of the potential of the first p$^+$-type semiconductor region 2 electrically connected to the signal line, and a waveform $\Phi_{RD}$ of a voltage applied to the n$^+$-type semiconductor region 4 serving as a reset drain, according to the third embodiment. The individual waveforms $\Phi_{RG}$, $\Phi_{YL}$, $\Phi_{XL}$, and $\Phi_{RD}$ are waveforms of a voltage or potential in a frame period $T_F$ between a first signal current readout period $T_{RO1}$ and a second signal current readout period $T_{RO2}$ that follows the first signal current readout period $T_{RO1}$.

Here, a reset operation is performed in a reset period $T_{RS}$ by applying a high-level voltage $V_H$ in a pulse waveform to the reset gate terminals $G_{RSL}$ and $G_{RSR}$ ($\Phi_{RG}$). In the case of FIG. 4, $\Phi_{YL}=V_L$, $\Phi_{XL}=V_{LA}$, and $\Phi_{RD}=V_{RD}$ (>$V_L$) are set in the reset period $T_{RS}$. Here, the potential $V_{LA}$ of the first p$^+$-type semiconductor region 2 is set to be the low-level voltage $V_L$ in the reset period $T_{RS}$ and the signal charge storage period $T_S$. In the signal current readout periods $T_{RO1}$ and $T_{RO2}$, the first p$^+$-type semiconductor region 2 is electrically connected to an external output circuit via the signal line and is thus at a low-level potential approximate to the low-level voltage $V_L$. Also, $V_{RD}$ (>$V_L$) is applied to a reset drain terminal RD ($\Phi_{RD}$) throughout the frame period $T_F$. Also, $\Phi_{RG}=V_L$, $\Phi_{YL}=V_L$, and $\Phi_{XL}=V_{LA}$ are set in the signal charge storage period $T_S$.

Then, in each of the signal current readout periods $T_{RO1}$ and $T_{RO2}$, $\Phi_{YL}=V_H$ is set, whereby a signal current is read out by the junction transistor. Here, a shutter period in the solid-state imaging device according to the third embodiment matches the signal charge storage period $T_S$.

In the solid-state imaging device according to the third embodiment, a signal current readout operation by the junction transistor and a reset operation of discharging signal charges stored in the photodiode in one pixel electrically connected to a certain signal line are performed in the first p$^+$-type semiconductor region 2 and the n$^+$-type semiconductor region 4 that are electrically isolated from each other, respectively, and thus a reset operation (reset period $T_{RS}$) in one pixel can be arbitrarily set within the frame period $T_F$ without being affected by a signal current readout operation in another pixel electrically connected to the same signal line. Accordingly, a high-speed shutter operation can be realized with a higher degree of freedom of setting the signal charge storage period $T_S$ between the reset period $T_{RS}$ and the signal current readout period $T_{RO2}$, that is, with a higher degree of freedom of setting a shutter operation.

Fourth Embodiment

Hereinafter, the structure of a pixel 1b of a solid-state imaging device according to a fourth embodiment of the present invention will be described with reference to FIG. 5. The pixel structure according to this embodiment illustrated in FIG. 5 is based on the pixel structure according to the first embodiment illustrated in FIG. 1.

The pixel structure according to the fourth embodiment is different from the pixel structure according to the first embodiment in that the first semiconductor tier 5a is constituted by the n$^+$-type semiconductor region 4 electrically connected to the reset drain terminal RD, the p-type semiconductor region 3, and an n$^+$-type semiconductor region 12 electrically connected to the signal wiring terminal XL. The second semiconductor tier 5b, the third semiconductor tier 5c, and the fourth semiconductor tier 5d illustrated in FIG. 5 have the same configurations as those in the pixel structure illustrated in FIG. 1A.

Figure 5:
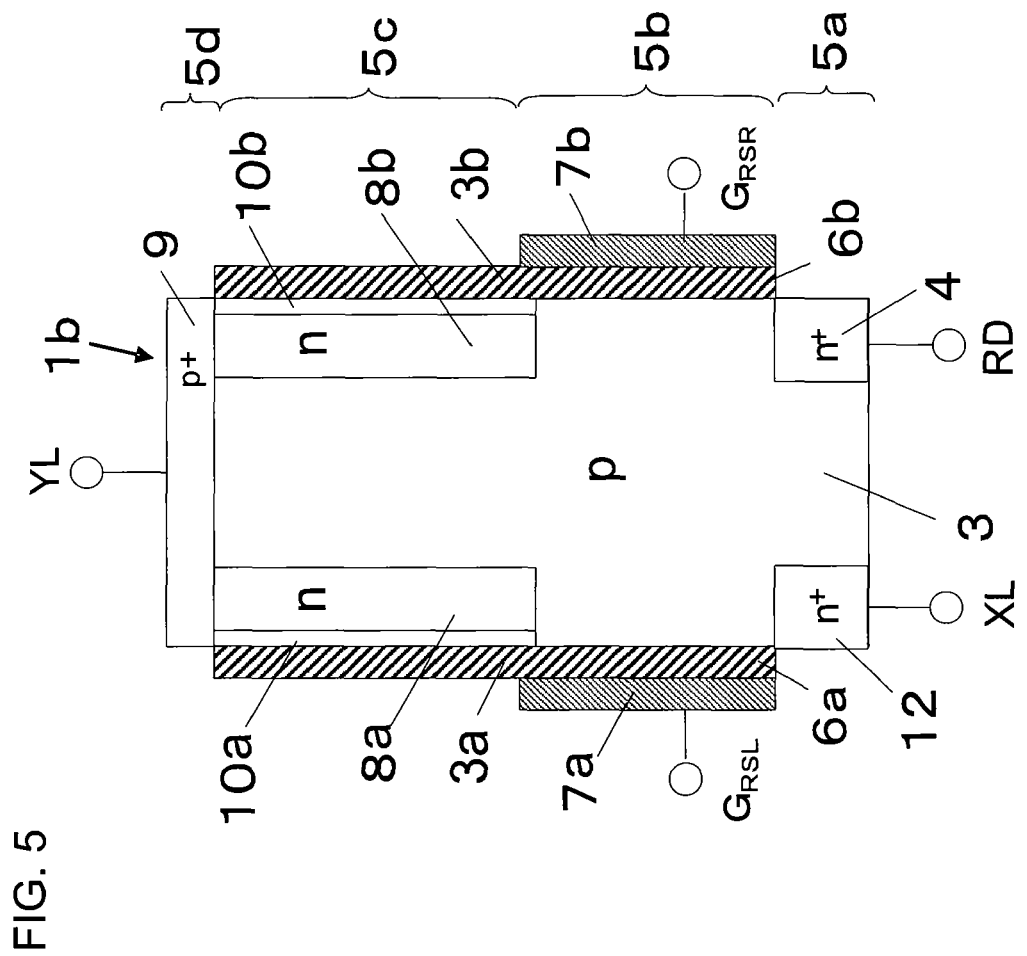
FIG. 5 is a schematic cross-sectional view illustrating the structure of a pixel in a solid-state imaging device according to a fourth embodiment.

Here, referring to FIG. 5, a junction transistor is formed in which the second p$^+$-type semiconductor region 9 electrically connected to the pixel selection wiring terminal YL serves as a source, the p-type semiconductor region 3 near n$^+$-type semiconductor region 12 electrically connected to the signal line serves as a drain, and the n-type semiconductor regions 8a and 8b of the photodiode serve as a gate.

The pixel region of the solid-state imaging device is exposed to light in a signal charge storage period $T_S$ (see FIG. 4) when light enters through the second p$^+$-type semiconductor region 9 electrically connected to the pixel selection wiring terminal YL. In this period, signal charges (in this case, free electrons) generated by a photoelectric effect are stored in the photodiode made up of the n-type semiconductor regions 8a and 8b and the p-type semiconductor region 3 that is formed in an expanded manner on the second semiconductor tier 5b (signal charge storage operation). In the signal charge storage period $T_S$, a low-level off voltage (negative voltage) is applied to the gate conductive electrodes 7a and 7b of the MOS transistor.

A photodiode voltage (gate voltage) that is applied to the n-type semiconductor regions 8a and 8b changes in accordance with the amount of signal charges stored in the photodiode. The channel width of the junction transistor is increased/decreased by the photodiode voltage. Then, a signal current flowing between the n$^+$-type semiconductor region 12 and the second p$^+$-type semiconductor region 9 (between the drain and source) of the junction transistor changes, and the signal current is read out as an output voltage (pixel signal) by the output circuit 204 (see FIG. 1C) from the signal wiring terminal XL (signal current readout operation). Then, the signal charges stored in the photodiode are discharged via the n$^+$-type semiconductor region 4 serving as a reset drain, by applying a high-level ON voltage (positive voltage) to the gate conductive electrodes 7a and 7b of the MOS transistor (reset operation).

In the fourth embodiment, the third p$^+$-type semiconductor regions 10a and 10b are provided for reducing the generation of dark current in the photodiode made up of the n-type semiconductor regions 8a and 8b and the p-type semiconductor region 3 formed in the third semiconductor tier 5c and on the second semiconductor tier 5b in an expanded manner, and for suppressing an afterimage and noise that occur when discharging the signal charges stored in this photodiode to the n$^+$-type semiconductor region 4 serving as a reset drain.

In the pixel structure according to the fourth embodiment illustrated in FIG. 5, readout of a signal current by the junction transistor is performed by applying a high-level voltage $V_H$ to the second p$^+$-type semiconductor region 9 electrically connected to the pixel selection wiring terminal YL and by causing the voltage of the n$^+$-type semiconductor region 12 electrically connected to the signal wiring terminal XL to be a low-level voltage $V_L$. Thus, a pn diode that is formed of the n$^+$-type semiconductor region 21 and the p-type semiconductor region 3 and that is in a forward bias state exists between the p-type semiconductor region 3, which is the drain of the junction transistor, and the signal wiring terminal XL. Thus, in order to operate the junction transistor in a forward current condition with a sufficiently low resistance in a signal current readout operation, it is necessary to apply a voltage of at least 0.7 V or more between the p$^+$-type semiconductor region 9 electrically connected to the pixel selection wiring terminal YL and the n$^+$-type semiconductor region 12 in order to sufficiently reduce the forward resistance of PN junction.

Also, in the pixel structure according to the fourth embodiment illustrated in FIG. 5, even in the case of performing an operation of discharging signal charges stored in the photodiode to the n$^+$-type semiconductor region 4 by changing the voltage applied to the gate conductive electrodes 7a and 7b of the MOS transistor, which has the p-type semiconductor region 3 formed in an expanded manner on the first semiconductor tier 5a, the insulating films 6a and 6b formed so as to surround the outer periphery portion of the p-type semiconductor region 3, and the gate conductive electrodes 7a and 7b electrically connected to the third wiring terminals $G_{RSL}$ and $G_{RSR}$, respectively, in the signal charge storage period $T_S$ (see FIG. 2C to FIG. 2F), the charges leak into not only the n$^+$-type semiconductor region 4 serving as a reset drain but also the n$^+$-type semiconductor region 12 that is electrically connected to the same signal line to which the n$^+$-type semiconductor region 4 is connected and that is at the same potential. Thus, an operation of expanding the dynamic range is not realized.

However, in the pixel structure according to the fourth embodiment illustrated in FIG. 5, the n$^+$-type semiconductor region 4 used for discharging the signal charges stored in the photodiode in a reset operation and the n$^+$-type semiconductor region 12 used for a signal current readout operation performed by the junction transistor are electrically isolated from each other by the p-type semiconductor region 3. The reset period $T_{RS}$ can be arbitrarily set within the frame period $T_F$ without being affected by a signal current readout operation in another pixel electrically connected to the same signal line. Therefore, a higher shutter speed can be realized with a high degree of freedom.

Fifth Embodiment

Hereinafter, a solid-state imaging device according to a fifth embodiment of the present invention will be described with reference to FIGS. 6A and 6B.

FIG. 6A illustrates an example in which the fifth embodiment is applied to the pixel 1a according to the first embodiment illustrated in FIG. 1A, and FIG. 6B illustrates an example in which the fifth embodiment is applied to the pixel 1b according to the fourth embodiment illustrated in FIG. 5.

In the solid-state imaging device illustrated in FIG. 6A, the first p+-type semiconductor region 2 electrically connected to the signal wiring terminal XL and semiconductor regions 13a and 13b constituting the source or drain of a MOS transistor M1, which is provided in an external scanning circuit or processing circuit electrically connected to a signal line S1, are p+-type semiconductor regions of the same conductivity type.

The MOS transistor M1 of the scanning circuit or processing circuit is used for capturing a signal current into an output circuit by applying an ON voltage to a gate terminal SG1 of the MOS transistor M1 in synchronization with the signal current readout periods $T_{RO1}$ and $T_{RO2}$ (see FIG. 4), for example.

In the solid-state imaging device illustrated in FIG. 6B, the n+-type semiconductor region 12 electrically connected to the signal wiring terminal XL and semiconductor regions 14a and 14b constituting the source or drain of a MOS transistor M2, which is provided in a scanning circuit or processing circuit electrically connected to a signal line S2, are n+-type semiconductor regions of the same conductivity type as the n+-type semiconductor region 4.

In the fifth embodiment, the conductivity types of the semiconductor regions 2 and 12 of the pixels 1a and 1b electrically connected to the signal lines S1 and S2 are the same as the conductivity types of the semiconductor regions 13a and 13b and the semiconductor regions 14a and 14b, respectively, constituting the source and drain of the MOS transistors M1 and M2 of the external scanning circuit or processing circuit electrically connected to the common signal lines S1 and S2. Accordingly, the semiconductor regions of the pixels 1a and 1b electrically connected to the signal lines S1 and S2 and the semiconductor regions forming the source or drain of the MOS transistors of the external scanning circuit or processing circuit electrically connected to the common signal lines are electrically integrated in the semiconductor regions of the same conductivity type. Thus, a voltage drop that occurs in the case of integrating different conductivity types of semiconductor regions between a pixel and an external circuit is prevented, and a decrease in power consumption is realized.

Sixth Embodiment

Hereinafter, a solid-state imaging device according to a sixth embodiment of the present invention will be described with reference to FIGS. 7 and 8.

Figure 7:
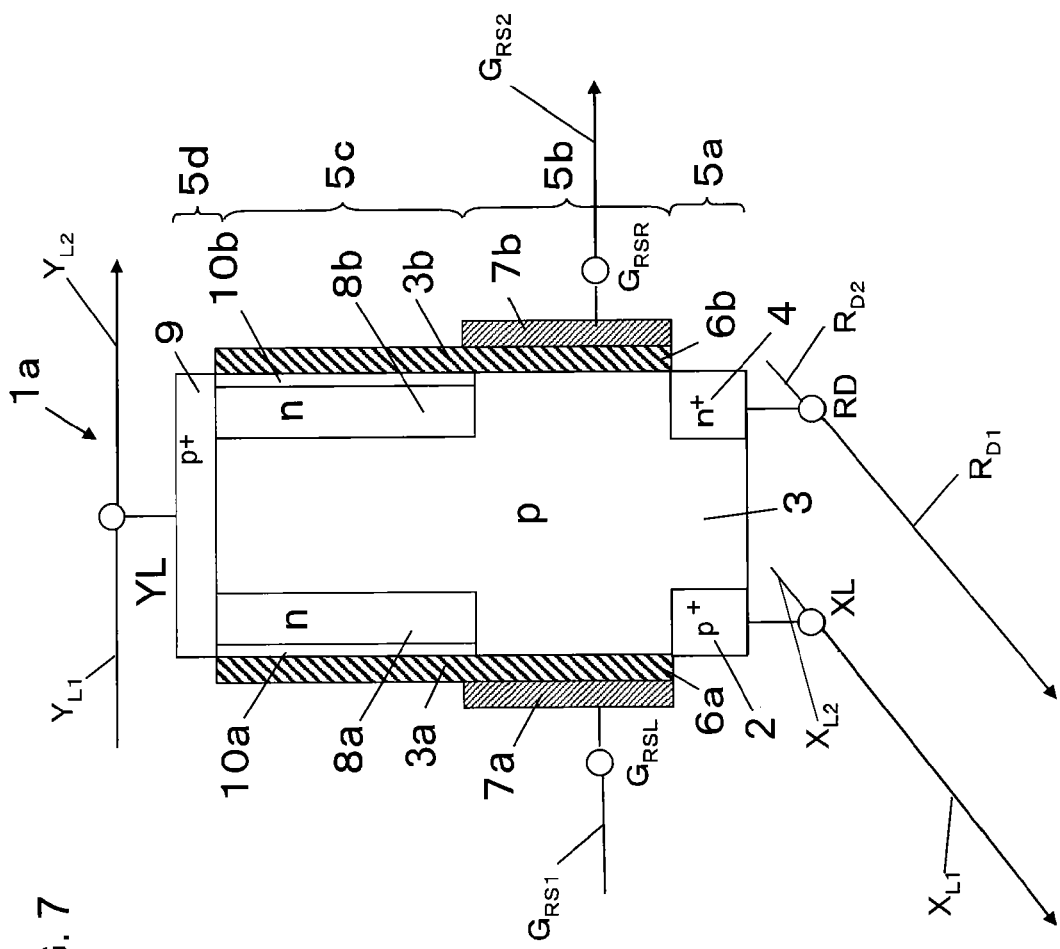
FIG. 7 is a diagram illustrating the structure of a pixel in a solid-state imaging device according to a sixth embodiment, and wiring connected to the pixel.

FIG. 7 illustrates the pixel 1a according to the first embodiment illustrated in FIG. 1, and signal lines $X_{L1}$, $X_{L2}$, $R_{D1}$, $R_{D2}$, $G_{RS1}$, $G_{RS2}$, $Y_{L1}$, and $Y_{L2}$ electrically connected to the respective wiring terminals XL, RD, $G_{RSL}$, $G_{RSR}$, and YL of the pixel 1a.

As illustrated in FIG. 7, in the solid-state imaging device according to the sixth embodiment, the signal lines $X_{L1}$ and $X_{L2}$ are electrically connected to the signal wiring terminal XL of the first p+-type semiconductor region 2. The reset drain wiring lines $R_{D1}$ and $R_{D2}$ are electrically connected to the reset drain terminal RD of the n+-type semiconductor region 4 serving as a reset drain. The reset gate wiring lines $G_{RS1}$ and $G_{RS2}$ are electrically connected to the reset gate terminals $G_{RSR}$ and $G_{RSL}$ electrically connected to the gate conductive electrodes 7a and 7b of the MOS transistor. The pixel selection lines $Y_{L1}$ and $Y_{L2}$ are electrically connected to the pixel selection wiring terminal YL electrically connected to the second p+-type semiconductor region 9. The signal lines $X_{L1}$ and $X_{L2}$ are orthogonal to the pixel selection lines $Y_{L1}$ and $Y_{L2}$, and the signal lines $X_{L1}$ and $X_{L2}$ are parallel to the reset drain wiring lines $R_{D1}$ and $R_{D2}$. The signal lines $X_{L1}$ and $X_{L2}$ need to be orthogonal to the pixel selection lines $Y_{L1}$ and $Y_{L2}$ in order to scan and select the individual pixels in an XY matrix in a signal current readout operation. On the other hand, the reset drain wiring lines $R_{D1}$ and $R_{D2}$ are not restricted in principle in the relationship with the signal lines $X_{L1}$ and $X_{L2}$, and need not be parallel thereto. However, the sixth embodiment is characterized in that the reset drain lines $R_{D1}$ and $R_{D2}$ are parallel to the signal lines $X_{L1}$ and $X_{L2}$.

As illustrated in FIG. 7, in the pixel structure according to the sixth embodiment, the first semiconductor tier 5a is provided with the first p+-type semiconductor region 2 and the n+-type semiconductor region 4 that are electrically isolated from each other. Also, the first p+-type semiconductor region 2 and the n+-type semiconductor region 4 are electrically connected to the signal lines $X_{L1}$ and $X_{L2}$ and the reset drain wiring lines $R_{D1}$ and $R_{D2}$ isolated from each other, respectively, and lead to an external circuit via these wiring lines. Thus, if the signal lines $X_{L1}$ and $X_{L2}$ are orthogonal to the reset drain wiring lines $R_{D1}$ and $R_{D2}$, it is necessary to incorporate this orthogonal multilayer wiring structure into the pixel. This complicates the process of manufacturing a solid-state imaging device and results in a decrease in pixel density and performance. However, in the pixel structure according to the sixth embodiment, such a restriction is eliminated because the signal lines $X_{L1}$ and $X_{L2}$ are orthogonal to the reset drain wiring lines $R_{D1}$ and $R_{D2}$, as described above.

Figure 8:
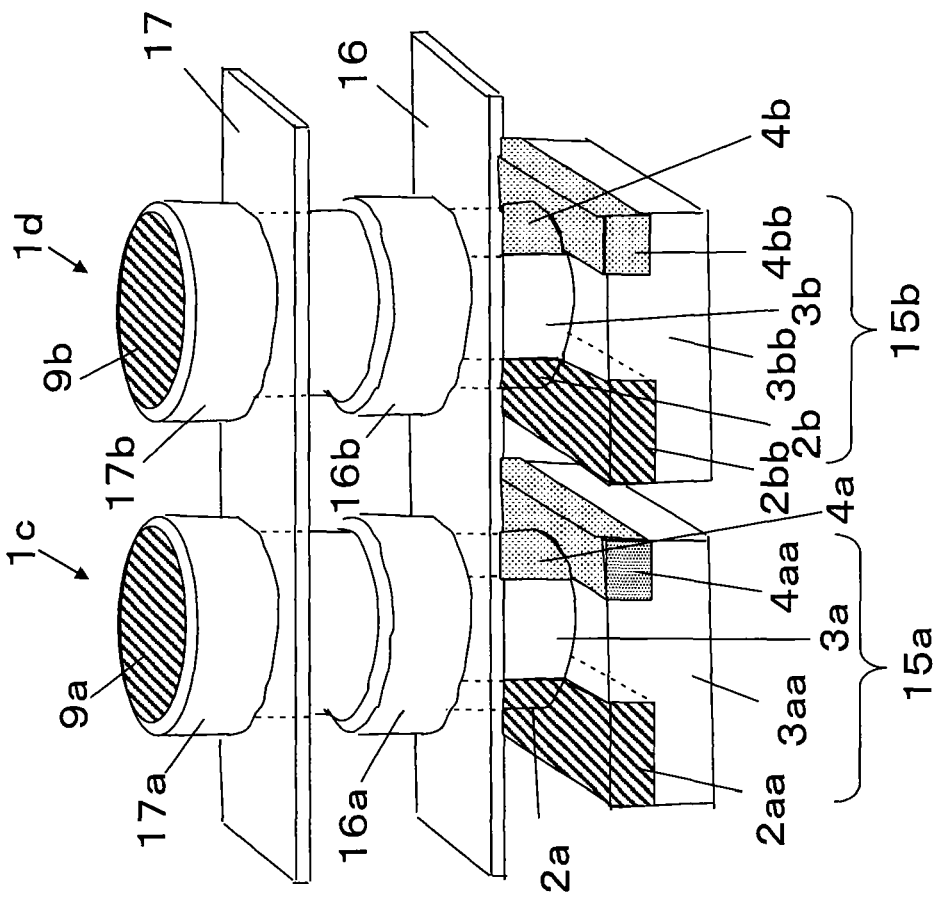
FIG. 8 is a schematic diagram illustrating a three-dimensional structure of two sequential pixels in the solid-state imaging device according to the sixth embodiment.

FIG. 8 illustrates two pixels 1c and 1d that have the same pixel structure as the pixel 1a illustrated in FIG. 7 and that are adjacent to each other, signal lines, reset drain wiring lines, reset gate wiring lines, and pixel selection lines. First p+-type semiconductor regions 2aa and 2bb, p-type semiconductor regions 3aa and 3bb, and n+-type semiconductor regions 4aa and 4bb are electrically connected to first p+-type semiconductor regions 2a and 2b, p-type semiconductor regions 3a and 3b, and n+-type semiconductor regions 4a and 4b serving as reset drains, respectively, in the first semiconductor tier 5a (see FIG. 7).

In lower regions of the individual pixels 1c and 1d, the p+-type semiconductor region 2aa, the p-type semiconductor region 3aa, and the n+-type semiconductor region 4aa form a band-shaped semiconductor 15a, and the p+-type semiconductor region 2bb, the p-type semiconductor region 3bb, and the n+-type semiconductor region 4bb form a band-shaped semiconductor 15b.

Here, the p+-type semiconductor regions 2aa and 2bb form signal lines, and the n+-type semiconductor regions 4aa and 4bb form reset drain wiring lines. Also, the pixels 1c and 1d having an island-shaped structure are formed on the respective band-shaped semiconductors 15a and 15b. Gate electrodes 16a and 16b of MOS transistors are formed so as to surround the outer periphery portions of the p-type semiconductor regions 3a and 3b. The gate electrodes 16a and 16b are electrically connected to a reset gate wiring line 16 extending in the horizontal (right and left) direction in FIG. 8, and lead to the outside. The band-shaped semiconductors 15a and 15b are orthogonal to the reset gate wiring line 16.

Second p+-type semiconductor regions 9a and 9b are electrically connected to the pixel selection wiring terminals YL (see FIG. 5) and are electrically connected to conductive electrodes 17a and 17b surrounding part or whole of the outer periphery portions of photodiodes. The conductive electrodes 17a and 17b are electrically connected to a pixel selection conductor wiring line 17 and lead to the outside (vertical-direction scanning circuit). The band-shaped semiconductors 15a and 15b are orthogonal to the pixel selection conductor wiring line 17.

According to the pixel structure according to the sixth embodiment, the p⁺-type semiconductor regions 2aa and 2bb serving as signal lines and the n⁺-type semiconductor regions 4aa and 4bb serving as reset drain wiring lines lead to the outside in a mutually parallel state along the vertical direction of a photosensitive region of the pixels without using a complicated multilayer wiring structure. Likewise, the reset gate wiring line 16 and the pixel selection conductor wiring line 17 lead to the outside in a mutually parallel state along the vertical direction of the photosensitive region of the pixels without using a complicated multilayer wiring structure.

Seventh Embodiment

Hereinafter, a solid-state imaging device according to a seventh embodiment will be described with reference to FIG. 9 and FIG. 10A to FIG. 10E.

Figure 9:
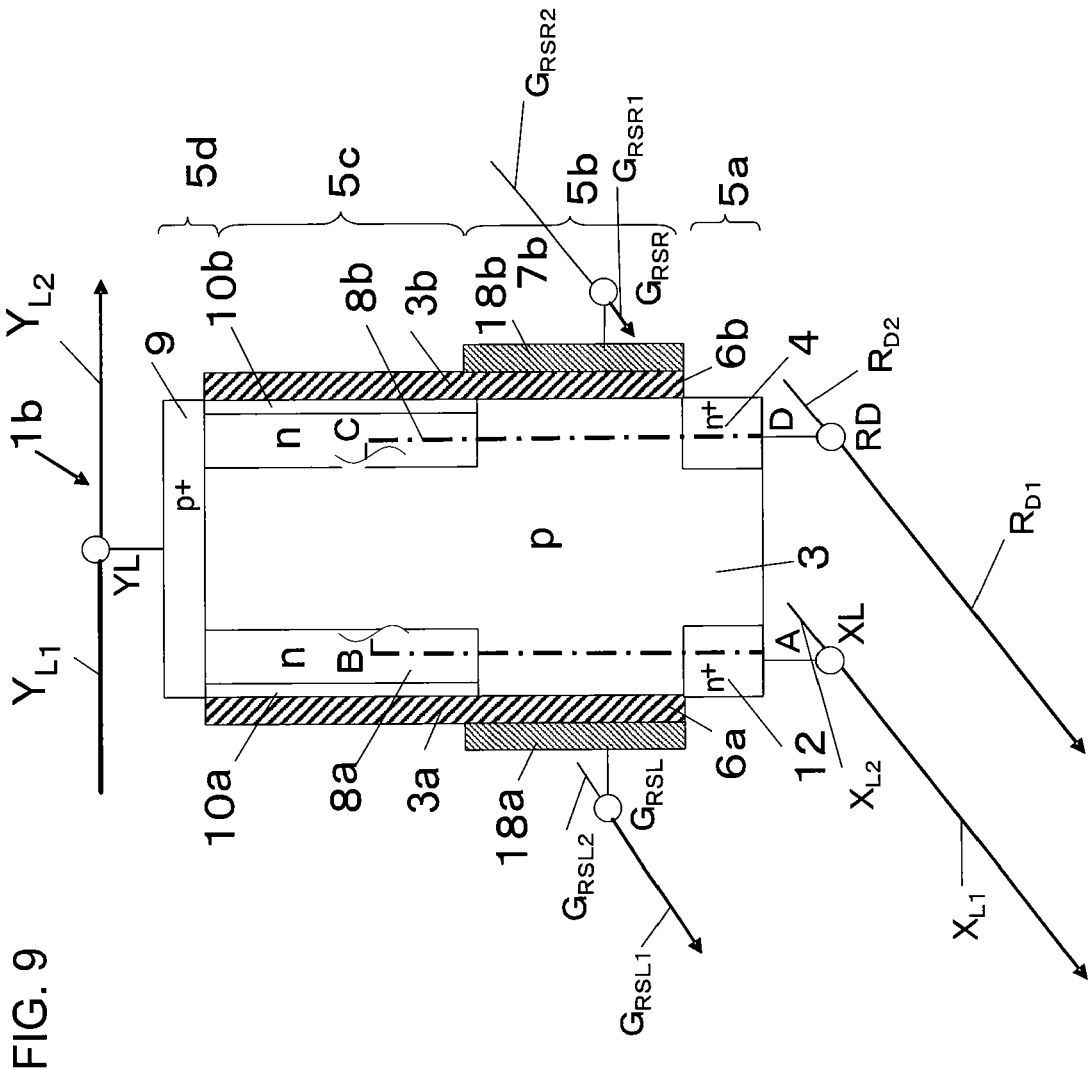
FIG. 9 is a diagram illustrating the structure of a pixel in a solid-state imaging device according to a seventh embodiment, and wiring connected to the pixel.

The structure of the pixel 1b illustrated in FIG. 9 is almost the same as the structure of the pixel 1b according to the fourth embodiment illustrated in FIG. 5 except the following points.

That is, in the pixel structure illustrated in FIG. 5, the gate conductive electrodes 7a and 7b of the MOS transistor are integrally formed in a ring shape so as to surround the outer periphery of the second semiconductor tier 5b having an island structure. In contrast, in the pixel structure illustrated in FIG. 9, gate conductive electrodes 18a and 18b are formed on the right and left side surfaces of an island structure while being electrically isolated from each other. Furthermore, the gate conductive electrode 18a is electrically connected to reset gate wiring lines $G_{RSL1}$ and $G_{RSL2}$, and the gate conductive electrode 18b is electrically connected to reset gate wiring lines $G_{RSR1}$ and $G_{RSR2}$. Here, the gate conductive electrode 18b is used to apply an ON voltage (positive voltage) at the time of a reset operation.

These reset gate wiring lines $G_{RSL1}$, $G_{RSL2}$, $G_{RSR1}$, and $G_{RSR2}$ are electrically connected in the same directions as the signal lines $X_{L1}$ and $X_{L2}$ electrically connected to the signal wiring terminal XL of the n⁺-type semiconductor region 12 for signal current and the reset drain wiring lines $R_{D1}$ and $R_{D2}$ electrically connected to the reset drain terminal RD of the n⁺-type semiconductor region 4 serving as a reset drain, and lead to the outside. The reset gate wiring lines $G_{RSR1}$ and $G_{RSR2}$ are electrically connected to the reset gate terminal $G_{RSR}$ electrically connected to the conductive electrode 18b of the MOS transistor. The pixel selection lines $Y_{L1}$ and $Y_{L2}$ are electrically connected to the pixel selection wiring terminal YL electrically connected to the second p⁺-type semiconductor region 9. The signal lines $X_{L1}$ and $X_{L2}$ and the pixel selection lines $Y_{L1}$ and $Y_{L2}$ are arranged so as to be orthogonal to each other.

As illustrated in FIG. 9, the signal lines $X_{L1}$ and $X_{L2}$ and the reset gate wiring lines $G_{RSL1}$ and $G_{RSL2}$ electrically connected to the conductive electrode 18a are formed on the same pixel side surface side (left side of the pixel in FIG. 9), and the reset drain wiring lines $R_{D1}$ and $R_{D2}$ and the reset gate wiring lines $G_{RSR1}$ and $G_{RSR2}$ electrically connected to the conductive electrode 18b are formed on the same pixel side surface side (right side of the pixel in FIG. 9). Furthermore, the reset gate wiring lines $G_{RSL1}$ and $G_{RSL2}$ and the reset gate wiring lines $G_{RSR1}$ and $G_{RSR2}$ are arranged so as to extend in the same directions, respectively. The configuration illustrated in FIG. 9 can be realized by extending the band-shaped semiconductors 15a and 15b illustrated in FIG. 8 to the first semiconductor tier 5a and the second semiconductor tier 5b in the pixel structure and integrating them with the first semiconductor tier 5a and the second semiconductor tier 5b into a band shape, respectively. Here, referring to FIG. 8, in the first semiconductor region 5a in the pixel structure, the p⁺-type semiconductor regions 2aa and 2bb in the band-shaped semiconductors 15a and 15b are integrated with the first p⁺-type semiconductor regions 2a and 2b so as to form a new first p⁺-type semiconductor region 2, and the n⁺-type semiconductor regions 4aa and 4bb in the band-shaped semiconductors 15a and 15b are integrated with the n⁺-type semiconductor region 4 so as to form a new n⁺-type semiconductor region 4.

FIG. 10A to FIG. 10E illustrate a temporal change of the potential distribution of a pixel when the above-described dynamic range expansion operation is applied to the solid-state imaging device illustrated in FIG. 9. A voltage having the waveform $\Phi_{RG}$ illustrated in FIG. 2B is applied to the gate conductive electrode 18b serving as a reset gate.

Figure 10:
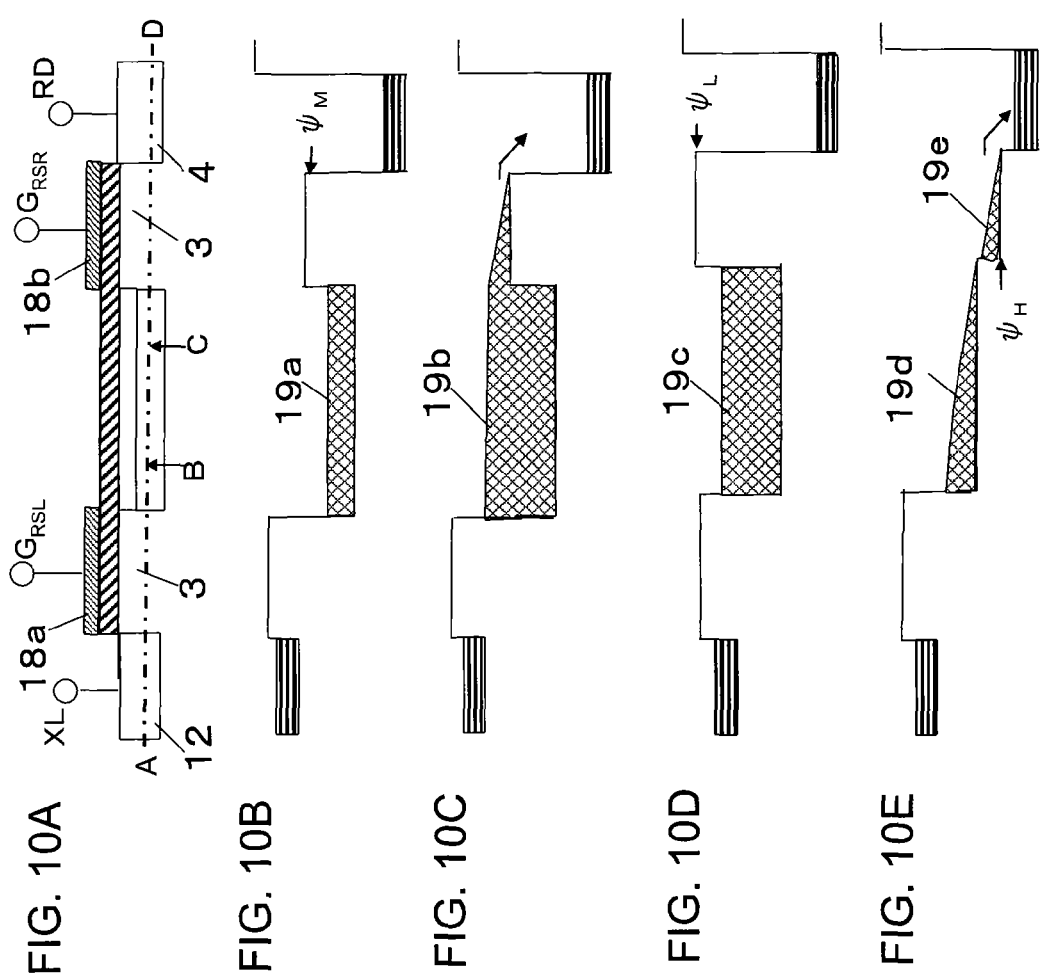
FIG. 10A illustrates a pixel structure for describing an operation of expanding a dynamic range performed by the solid-state imaging device according to the seventh embodiment.
FIG. 10B is a potential distribution diagram in the operation of expanding a dynamic range performed by the solid-state imaging device.
FIGS. 10C to 10E are potential distribution diagrams in the operation of expanding a dynamic range performed by the solid-state imaging device.

FIG. 10A illustrates a cross-sectional view of the pixel along the A-B-C-D line in FIG. 9. The B-C line in FIG. 10A is based on that the n-type semiconductor regions 8a and 8b of the photodiode are ring-shaped along the outer periphery portion of the third semiconductor tier 5c formed in an island shape. Also, the gate conductive electrode 18a and the gate conductive electrode 18b are electrically isolated from each other on the side of a portion where the p⁺-type semiconductor regions 2aa and 2bb in the band-shaped semiconductors 15a and 15b are integrated with the first p⁺-type semiconductor regions 2a and 2b (the side of the first p⁺-type semiconductor region 2) and on the side of a portion where the n⁺-type semiconductor regions 4aa and 4bb in the band-shaped semiconductors 15a and 15b are integrated with the n⁺-type semiconductor regions 4 (the side of the n⁺-type semiconductor region 4) (see FIG. 8).

First, as illustrated in FIG. 10B, in an initial period in the first signal charge storage period $T_1$ (see FIG. 2B), signal charges (free electrons) 19a generated through exposure to light are stored in the n-type semiconductor regions 8a and 8b of the photodiode. In this period, the channel potential of the p-type semiconductor region 3 below the gate conductive electrode 18b is a middle-level potential $\psi_M$ (voltage applied to the gate conductive electrodes 18a and 18b in this period=middle-level voltage $V_M$), and the channel potential of the p-type semiconductor region 3 below the gate conductive electrode 18a is a low-level potential $\psi_L$. In this state, the amount of signal charges 19b stored in the photodiode gradually increases in accordance with exposure to light.

Subsequently, as illustrated in FIG. 10C, when the light intensity becomes higher than a certain threshold level, the channel potential of the p-type semiconductor region 3 below the gate conductive electrode 18b exceeds the middle-level potential $\psi_M$, so that part of the stored signal charges 19b, that is, an excess portion of the signal charges 19b, is discharged to the n⁺-type semiconductor region 4 serving as a reset drain. In this state, the amount of the signal charges 19b stored in the photodiode does not increase even if the light intensity L becomes higher than the light intensity Lk (see FIG. 3).

Subsequently, as illustrated in FIG. 10D, in the second signal charge storage period $T_2$, a low-level voltage $V_L$ is applied to the gate conductive electrode 18b serving as a reset gate, and the channel potential of the p-type semiconductor region 3 below the gate conductive electrode 18b becomes the low-level potential $\psi_L$. Accordingly, the potential of the channel potential with respect to signal charges decreases, so that the stored signal charges 19c are stored in the photodiode without being discharged to the n⁺-type semiconductor region 4 serving as a reset drain.

Subsequently, as illustrated in FIG. 10E, in the reset period $T_3$, a high-level voltage $V_H$ is applied to the gate conductive electrode 18b, and the channel potential of the p-type semiconductor region 3 below the gate conductive electrode 18b becomes the high-level potential $\psi_H$. Accordingly, the potential of the channel potential with respect to signal charges increases, so that the signal charges 19d and 19e stored in the photodiode are discharged to the n⁺-type semiconductor region 4 serving as a reset drain.

As described above, in the periods illustrated in FIG. 10B to FIG. 10E, a low-level voltage $V_L$ is applied to the gate conductive electrode 18a that is positioned between the n⁺-type semiconductor region 12 electrically connected to the signal line and the photodiode, thereby preventing injection of free electrons from the n⁺-type semiconductor region 12, the potential thereof being approximate to the low-level voltage $V_L$, into the photodiode.

As described above, in the solid-state imaging device according to the seventh embodiment, injection of free electrons from the n⁺-type semiconductor region 12 into the photodiode is prevented. Thus, in the pixel structure in which the n⁺-type semiconductor region 12 is electrically connected to the signal line, a signal current readout amount decreases with respect to a light intensity between the light intensity Lk and the light intensity $L_2$ (see FIG. 3). As a result, the dynamic range expands when the noise level is the same.

In the first to seventh embodiments, a description has been given of the structure and operation of solid-state imaging devices using one or two pixels. However, the technical spirit of the present invention is not limited thereto, and can of course be applied to a solid-state imaging device in which a plurality of pixels are arranged in a one-dimensional or two-dimensional manner.

In the first embodiment illustrated in FIG. 1, a description has been given of the case where the first p⁺-type semiconductor region 2 is electrically connected to the signal line and the second p⁺-type semiconductor region 9 is electrically connected to the pixel selection line. Alternatively, the first p⁺-type semiconductor region 2 may be electrically connected to the pixel selection line and the second p⁺-type semiconductor region 9 may be electrically connected to the signal line, as long as the pixels can be XY-addressed in a signal current readout operation.

In the first to seventh embodiments, the conductivity types of the semiconductor regions of pixels are fixed to n-type, n⁺-type, p-type, and p⁺-type. Alternatively, in the individual embodiments, the conductivity types of the individual semiconductor regions of pixels may be opposite to those in the first to seventh embodiments, that is, p-type, p⁺-type, n-type, and n⁺-type.

In the second embodiment illustrated in FIG. 2A to FIG. 2F, the middle-level voltage $V_M$ is applied in the first signal charge storage period $T_1$ for storing signal charges in the photodiode, the low-level voltage $V_L$ is applied in the second signal charge storage period $T_2$, and the high-level voltage $V_H$ is applied in the reset period $T_3$, to the gate conductive electrodes 7a and 7b of the MOS transistor, which is made up of the p-type semiconductor region 3 formed in an expanded manner on the first semiconductor tier 5a, the insulating films 6a and 6b, and the gate conductive electrodes 7a and 7b. Alternatively, the middle-level voltage $V_M$ that is temporally changed may be applied to the gate conductive electrodes 7a and 7b of the MOS transistor. Also, the output voltage Vout with respect to the light intensity L may be controlled by applying a voltage with a plurality of pulses in the first signal charge storage period $T_1$ and the second signal charge storage period $T_2$.

In the above-described first to seventh embodiments, a plurality of pixels are arranged in a one-dimensional or two-dimensional manner and the pixels are connected to one another using linear wiring. Alternatively, the plurality of pixels may be arranged in a staggered pattern.

In the above-described first to seventh embodiments, the channel of the MOS transistor is formed using an electric field in the p-type semiconductor region 3 in the second semiconductor tier 5b (enhancement type). Alternatively, the channel of the MOS transistor may be formed by, for example, implanting impurities into the p-type semiconductor region 3 using ion implantation or the like (depletion type).

In the above-described first embodiment, a junction transistor is formed in which the second p⁺-type semiconductor region 9 electrically connected to the pixel selection wiring terminal YL functions as a source, and the first p⁺-type semiconductor region 2 electrically connected to the signal wiring terminal XL functions as a drain. Alternatively, in the junction transistor, the second p⁺-type semiconductor region 9 electrically connected to the pixel selection wiring terminal YL may function as a drain, and the first p⁺-type semiconductor region 2 electrically connected to the signal wiring terminal XL may function as a source.

In the above-described first to seventh embodiments, a description has been given of the solid-state imaging device in which signal charges are generated in pixels through exposure to light. However, the technical spirit of the present invention is not limited thereto, and may be applied to a solid-state imaging device in which signal charges are generated in pixels through exposure to electromagnetic energy waves, such as visible light, ultraviolet rays, infrared rays, X rays, radiation, and electron beams.

In the above-described first to seventh embodiments, at least the third semiconductor tier 5c and the fourth semiconductor tier 5d are formed in a cylindrical island-shaped structure. Alternatively, this island-shaped semiconductor may be a polygon, such as hexagon, or may have another shape.

In the above-described first to seventh embodiments, the signal wiring terminal XL, the reset drain terminal RD, the pixel selection wiring terminal YL, and the reset gate terminals $G_{RSR}$ and $G_{RSL}$ are illustrated in the figures. Note that these terminals are provided for easy understanding of the technical spirit of the present invention, and are integrated with the wiring or semiconductor region in an actual solid-state imaging device.

In the present invention, various embodiments and modifications are acceptable without deviating from the broad spirit and scope of the present invention. Also, the above-described embodiments are for describing an example of the present invention, and are not intended to limit the scope of the present invention.

What is claimed is:

1. A solid-state imaging device in which a plurality of pixels are arranged in a pixel region, each of the plurality of pixels comprising:
   a first semiconductor tier formed on a substrate and having a first semiconductor region, a second semiconductor region that is in contact with the first semiconductor region, and a third semiconductor region that is in contact with the second semiconductor region and that is not in contact with the first semiconductor region;
   a second semiconductor tier formed on the first semiconductor tier and having the second semiconductor region and conductive electrodes that are formed in an outer periphery portion of the second semiconductor region, with insulating films interposed between the second semiconductor region and the conductive electrodes;
   a third semiconductor tier formed on the second semiconductor tier and having the second semiconductor region and a fourth semiconductor region that is formed in an outer periphery portion of the second semiconductor region; and a fourth semiconductor tier formed on the third semiconductor tier and having a fifth semiconductor region that is in contact with the second semiconductor region, wherein the second semiconductor region and the fourth semiconductor region in the third semiconductor tier form a photodiode that stores signal charges generated in the pixel through exposure to electromagnetic energy waves, wherein the fourth semiconductor region, which functions as a gate, the second semiconductor region, which functions as a channel, and the first semiconductor region and the fifth semiconductor region, one of which functions as a drain and the other of which functions as a source, form a junction transistor that reads out a pixel signal by measuring a signal current that changes in accordance with an amount of signal charges stored in the photodiode, wherein the conductive electrodes, which function as a gate, the second semiconductor region, which functions as a channel, and the third semiconductor region, which functions as a drain, form a MOS transistor that discharges the signal charges stored in the photodiode to the third semiconductor region, wherein the first semiconductor region is electrically connected to a first external circuit disposed outside the pixel region, wherein the third semiconductor region is electrically connected to a second external circuit disposed outside the pixel region, wherein the conductive electrodes are electrically connected to a third external circuit disposed outside the pixel region, wherein the fifth semiconductor region is electrically connected to a fourth external circuit disposed outside the pixel region, and wherein at least the third semiconductor tier and the fourth semiconductor tier form an island-shaped structure.

2. The solid-state imaging device according to claim 1, wherein the first semiconductor region and the fifth semiconductor region are of the same conductivity type, the second semiconductor region is of the same conductivity type as the first semiconductor region or of a substantially intrinsic type, and the third semiconductor region and the fourth semiconductor region are of a conductivity type opposite to the conductivity type of the first semiconductor region.

3. The solid-state imaging device according to claim 1, wherein the MOS transistor discharges signal charges to the third semiconductor region without leaking the signal charges to the first semiconductor region by applying a voltage that temporally changes to the conductive electrodes during a period for storing the signal charges in the photodiode.

4. The solid-state imaging device according to claim 1, each of the plurality of pixels further comprising:

a fifth semiconductor tier that is band-shaped and that is orthogonal to a direction in which a wiring line for electrically connecting the fifth semiconductor region and the fourth external circuit extends, the fifth semiconductor tier being formed between the substrate and the first semiconductor tier, wherein the fifth semiconductor tier includes a sixth semiconductor region that is connected to the first semiconductor region and that is of the same conductivity type as the first semiconductor region, a seventh semiconductor region that is connected to the second semiconductor region and that is of the same conductivity type as the second semiconductor region, and an eighth semiconductor region that is connected to the third semiconductor region and that is of the same conductivity type as the third semiconductor region.

5. The solid-state imaging device according to claim 4, wherein both the first semiconductor tier and the second semiconductor tier are formed in a band shape by being integrated with the fifth semiconductor tier, wherein, in the fifth semiconductor tier, the sixth semiconductor region is integrated with the first semiconductor region, and the eighth semiconductor region is integrated with the third semiconductor region, and wherein the conductive electrodes of the MOS transistor are electrically isolated from each other on a side of a portion where the sixth semiconductor region in the fifth semiconductor tier is integrated with the first semiconductor region and on a side of a portion where the eighth semiconductor region in the fifth semiconductor tier is integrated with the third semiconductor region.

6. The solid-state imaging device according to claim 1, wherein a MOS transistor in the first external circuit is electrically connected to the first semiconductor region, and a source and a drain of the MOS transistor are formed of a semiconductor of the same conductivity type as the first semiconductor region.

* * * * *